(12) United States Patent
Otsubo et al.

(10) Patent No.: US 10,582,175 B2
(45) Date of Patent: Mar. 3, 2020

(54) IMAGING SENSOR AND IMAGING DEVICE

(71) Applicant: MAXELL, LTD., Otokuni-gun, Kyoto (JP)

(72) Inventors: Hiroyasu Otsubo, Ibaraki (JP); Osamu Ishizaki, Ibaraki (JP)

(73) Assignee: MAXELL, LTD., Kyoto (JP)

( * ) Notice: Subject to any disclaimer, the term of this patent is extended or adjusted under 35 U.S.C. 154(b) by 108 days.

(21) Appl. No.: 15/320,234

(22) PCT Filed: Jun. 24, 2015

(86) PCT No.: PCT/JP2015/068280
§ 371 (c)(1),
(2) Date: Dec. 19, 2016

(87) PCT Pub. No.: WO2015/199163
PCT Pub. Date: Dec. 30, 2015

(65) Prior Publication Data
US 2017/0150071 A1 May 25, 2017

(30) Foreign Application Priority Data

Jun. 24, 2014 (JP) ................................ 2014-129636
Oct. 29, 2014 (JP) ................................ 2014-220183

(51) Int. Cl.
*H04N 5/33* (2006.01)
*H01L 27/146* (2006.01)
(Continued)

(52) U.S. Cl.
CPC .............. *H04N 9/735* (2013.01); *G02B 5/20* (2013.01); *G02B 5/201* (2013.01); *G02B 5/208* (2013.01);
(Continued)

(58) Field of Classification Search
CPC ........... G02B 5/20; G02B 5/201; G02B 5/208
See application file for complete search history.

(56) References Cited

U.S. PATENT DOCUMENTS

2007/0045517 A1   3/2007  Fukuyoshi et al.
2008/0278592 A1*  11/2008  Kuno ..................... H04N 5/332
                                                                     348/222.1
(Continued)

FOREIGN PATENT DOCUMENTS

JP      2004-032243 A    1/2004
JP      2006-010764 A    1/2006
(Continued)

OTHER PUBLICATIONS

Aug. 18, 2015 Written Opinion issued in International Patent Application No. PCT/JP2015/068280.
(Continued)

*Primary Examiner* — Anand S Rao
*Assistant Examiner* — Tyler B Edwards
(74) *Attorney, Agent, or Firm* — Oliff PLC

(57) ABSTRACT

An imaging sensor includes a color filter, and DBPF that has a transmission characteristic in a visible-light band, a blocking characteristic in a first wavelength band adjacent to a long-wavelength side of the visible-light band, and a transmission characteristic in a second wavelength band that is a part of the first wavelength band. A transmission characteristic of DBPF and a transmission characteristic of each filter part of the color filter are set in such a manner that the second wavelength band of DBPF is included in a third wavelength band that is a wavelength band in which transmittance of the filter parts in colors is approximate to each other on a long-wavelength side of the visible-light band and
(Continued)

a fourth wavelength band that is a wavelength band in which a filter part for infrared light has a transmission characteristic.

20 Claims, 27 Drawing Sheets

(51) Int. Cl.
| | |
|---|---|
| *G02B 5/20* | (2006.01) |
| *H04N 9/07* | (2006.01) |
| *H04N 5/225* | (2006.01) |
| *H04N 9/73* | (2006.01) |
| *H01L 27/148* | (2006.01) |
| *H04N 5/202* | (2006.01) |
| *H04N 5/243* | (2006.01) |

(52) U.S. Cl.
CPC .. *H01L 27/14603* (2013.01); *H01L 27/14621* (2013.01); *H01L 27/14623* (2013.01); *H01L 27/14625* (2013.01); *H01L 27/14645* (2013.01); *H01L 27/14652* (2013.01); *H01L 27/14868* (2013.01); *H04N 5/202* (2013.01); *H04N 5/2253* (2013.01); *H04N 5/2254* (2013.01); *H04N 5/2256* (2013.01); *H04N 5/243* (2013.01); *H04N 5/33* (2013.01); *H04N 5/332* (2013.01); *H04N 9/07* (2013.01)

(56) References Cited

U.S. PATENT DOCUMENTS

| | | | | |
|---|---|---|---|---|
| 2011/0235017 | A1* | 9/2011 | Iwasaki | H04N 5/2354 356/4.01 |
| 2013/0188057 | A1* | 7/2013 | Lin | H04N 5/332 348/164 |
| 2013/0229526 | A1* | 9/2013 | Matsuno | H04N 5/332 348/164 |

FOREIGN PATENT DOCUMENTS

| | | |
|---|---|---|
| JP | 2006-094112 A | 4/2006 |
| JP | 2008-289000 A | 11/2008 |
| JP | 2011-199798 A | 10/2011 |
| JP | 5009395 B2 | 8/2012 |
| JP | 2013-192214 A | 9/2013 |
| JP | 2013-211836 A | 10/2013 |
| WO | 2006/003807 A1 | 1/2006 |

OTHER PUBLICATIONS

Jan. 9, 2018 Office Action issued in Japanese Patent Application No. 2016-529644.

Aug. 18, 2015 International Search Report issued in International Patent Application No. PCT/JP2015/068280.

Aug. 27, 2019 Notice of Reasons for Refusal issued in Japanese Patent Application No. 2018-171401.

* cited by examiner

[Fig 1]
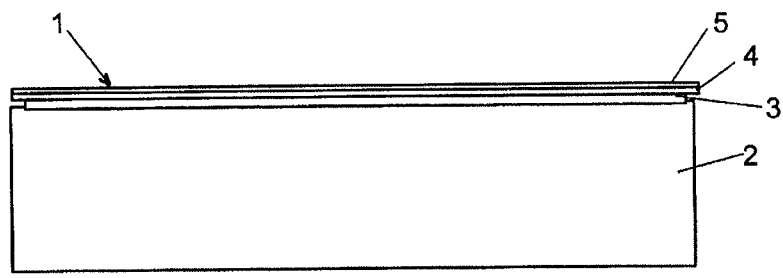
[Fig. 2]
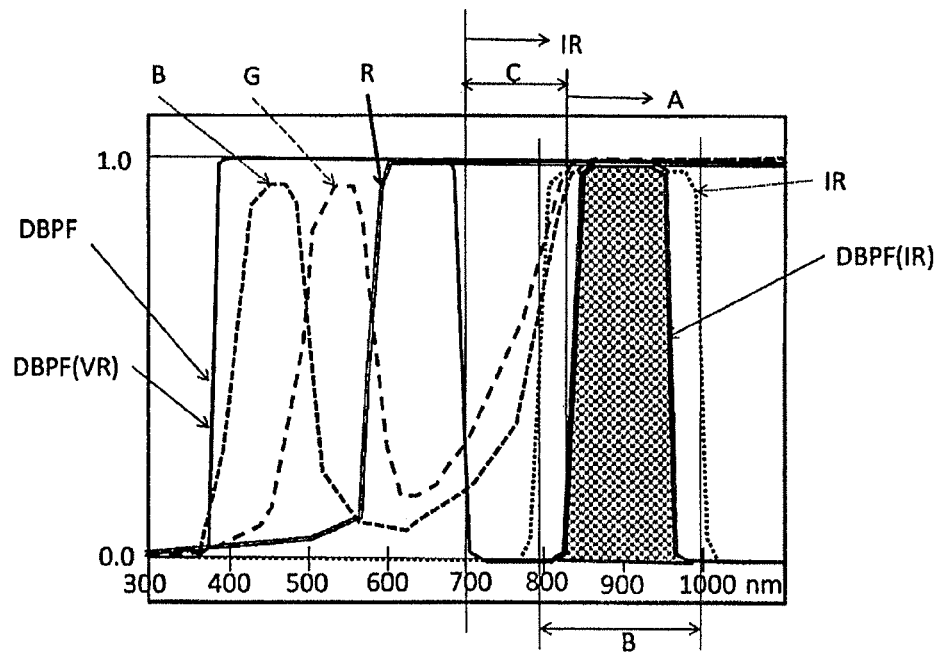

[Fig. 3]
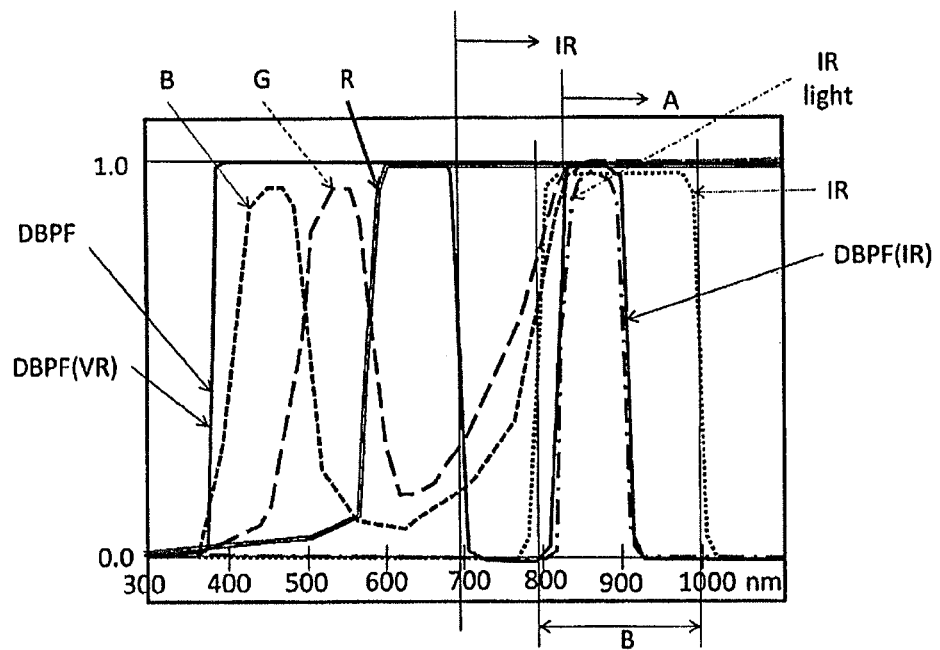
[Fig. 4]
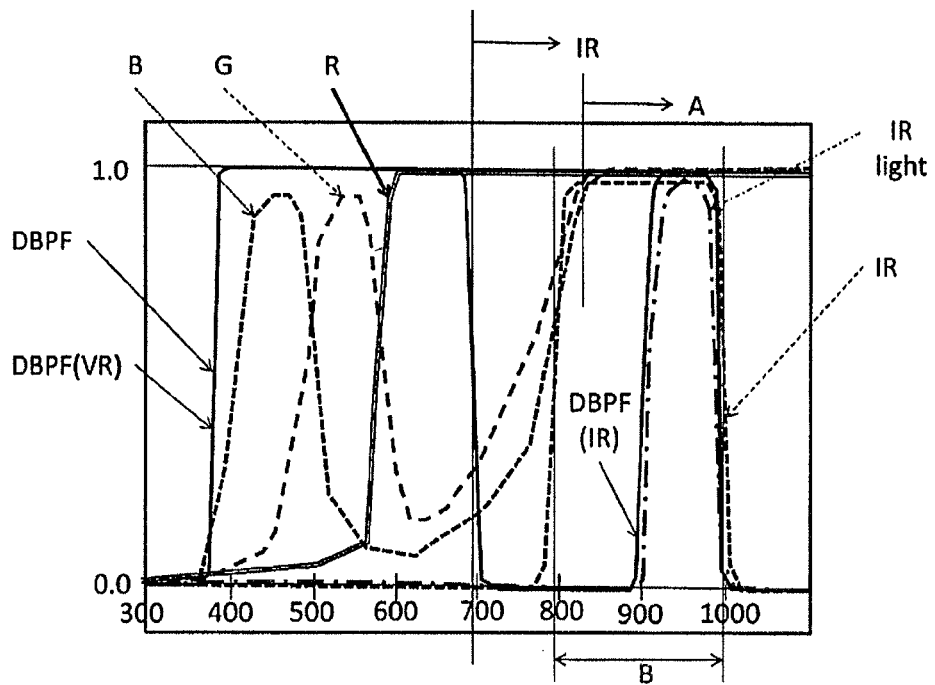

|   | 1 | 2 | 3 | 4 |
|---|---|---|---|---|
| 1 | R | G | R | G |
| 2 | G | B | G | B |
| 3 | R | G | R | G |
| 4 | G | B | G | B |

3x (b)

|   | 1 | 2 | 3 | 4 |
|---|---|---|---|---|
| 1 | R | IR | R | IR |
| 2 | G | B | G | B |
| 3 | IR | R | IR | R |
| 4 | B | G | B | B |

3a (c)

|   | 1 | 2 | 3 | 4 |
|---|---|---|---|---|
| 1 | R | G | R | G |
| 2 | G | B | G | IR |
| 3 | R | G | R | G |
| 4 | G | IR | G | B |

3b (d)

|   | 1 | 2 | 3 | 4 |
|---|---|---|---|---|
| 1 | R | G | IR | G |
| 2 | G | B | G | IR |
| 3 | IR | G | R | G |
| 4 | G | IR | G | B |

3c

[Fig. 6]
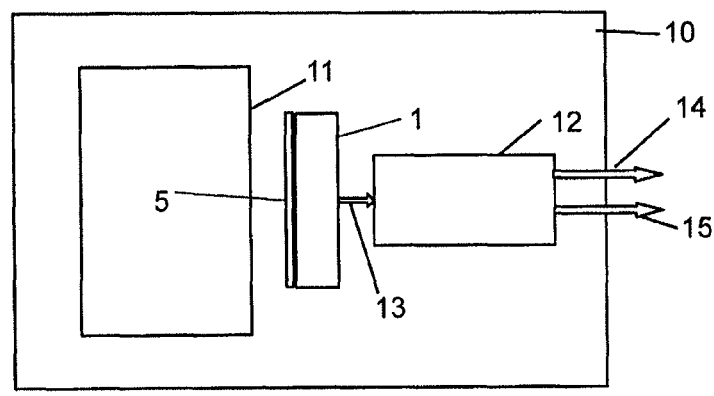
[Fig. 7]
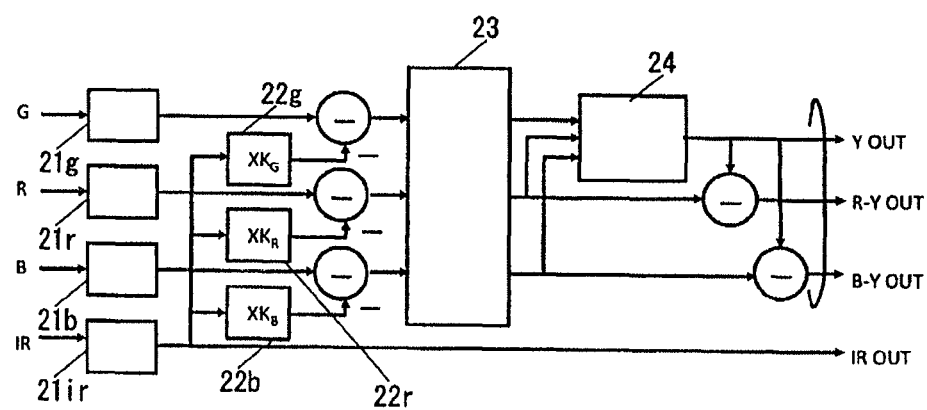

[Fig 8]
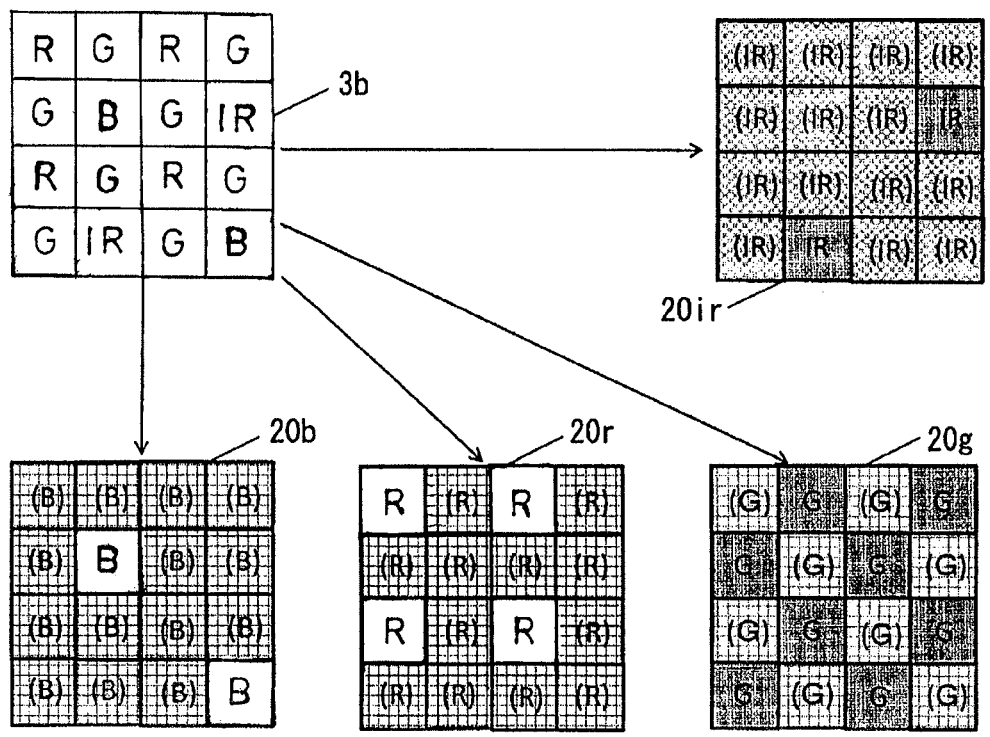
[Fig. 9]
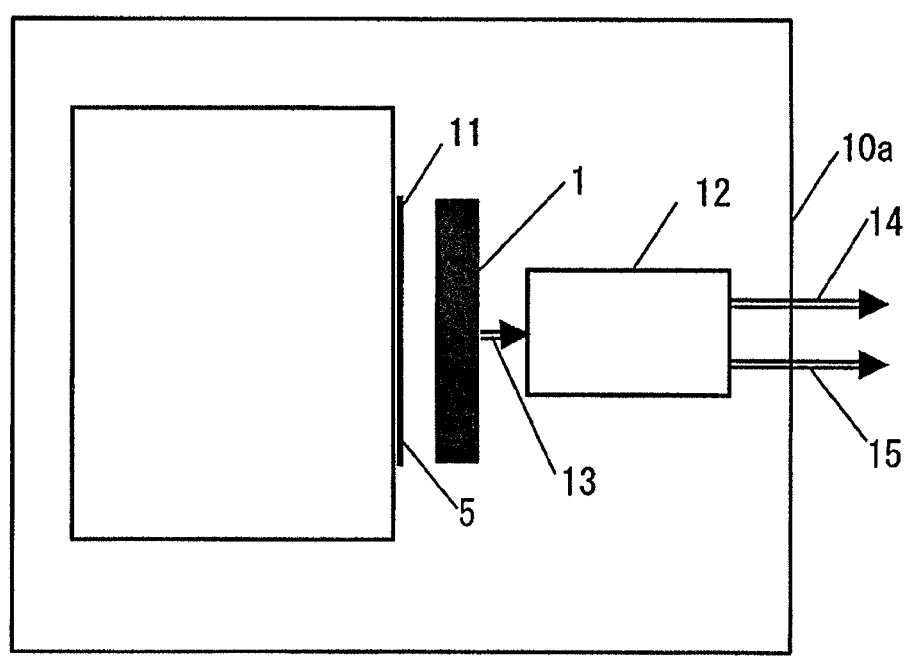

[Fig 10]
| R | C | G | C |
|---|---|---|---|
| C | R | C | G |
| G | C | B | C |
| C | G | C | B |
}~ 3e
[Fig 11]
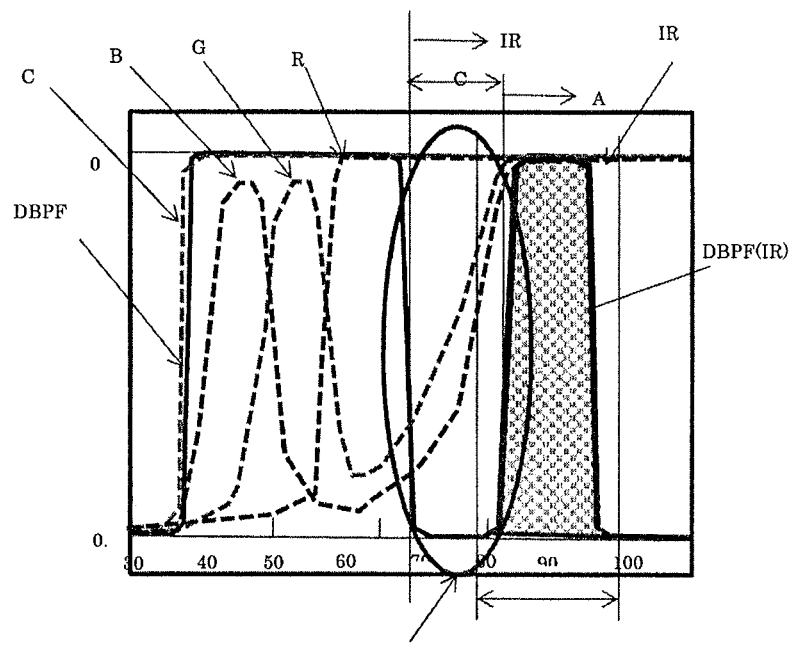
[Fig. 12]
| R | C |
|---|---|
| G | B |

[Fig. 13]

| R | G |
|---|---|
| G | B |

[Fig. 14]

| R | IR |
|---|----|
| G | B  |

[Fig. 15]

|  | luminance resolution | color resolution | sensitivity to W = 1 | relative sensitivity |
|---|---|---|---|---|
| RGB-C configuration1 | ◎ | △~× | 0.675 | +5.7dB |
| RGB-C configuration2 | ○ | ○ | 0.5 | +3.1dB |
| RGB | ○ | ○ | 0.35 | 0dB |
| RGB-IR | △ | ○ | 0.25 | -2.9dB |

[Fig. 16]
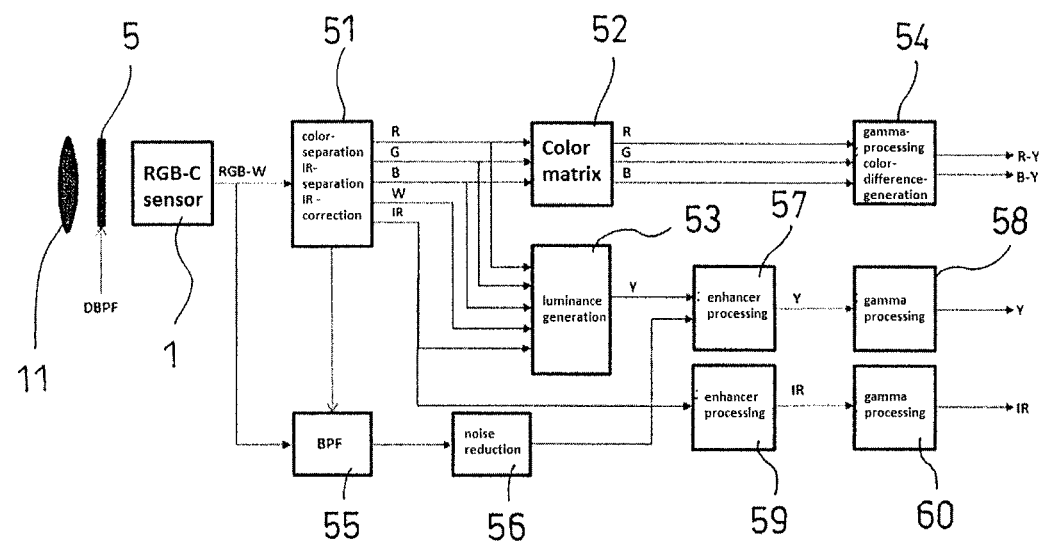
[Fig. 17]
| A | D |
|---|---|
| B | C |

[Fig. 18]
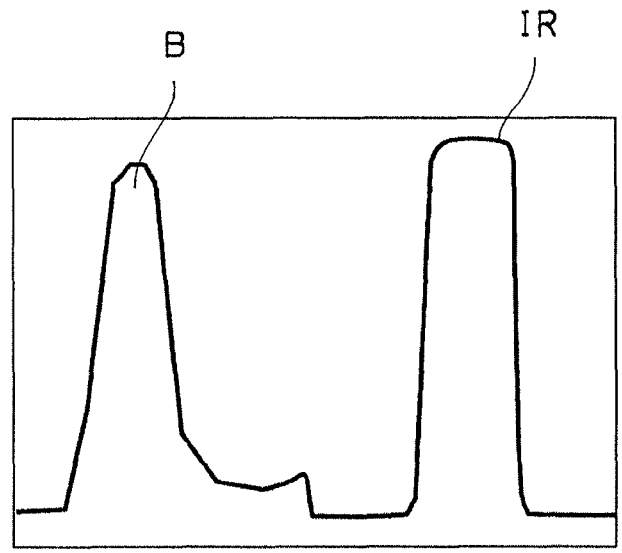
[Fig. 19]
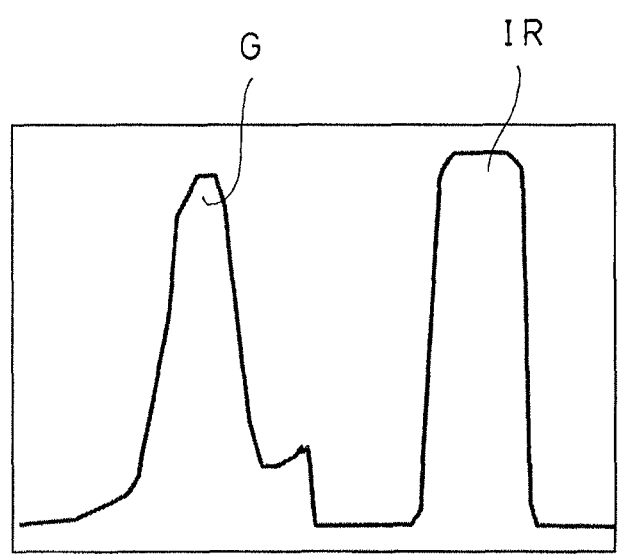

[Fig. 20]
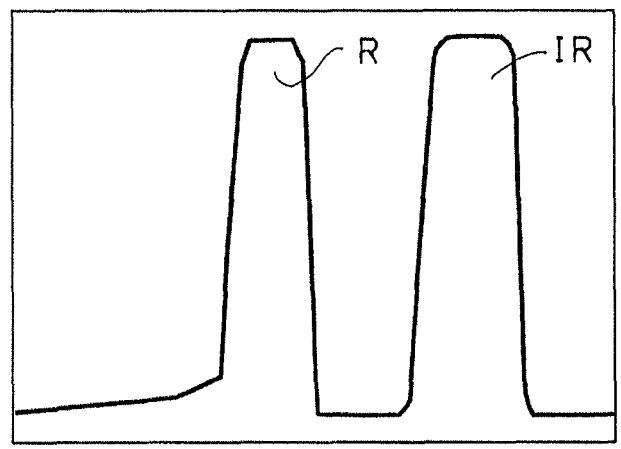
[Fig. 21]
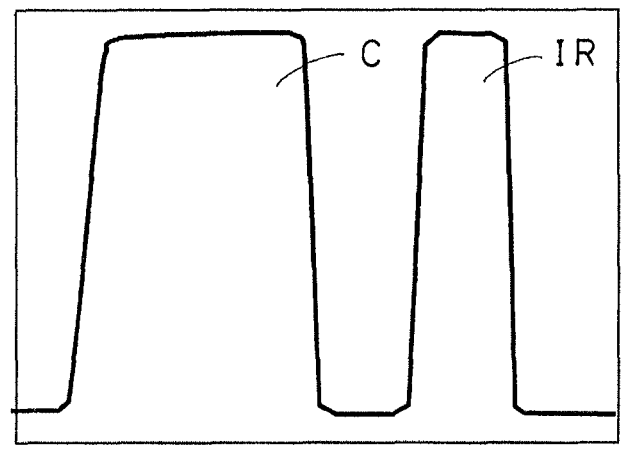

[Fig. 22]
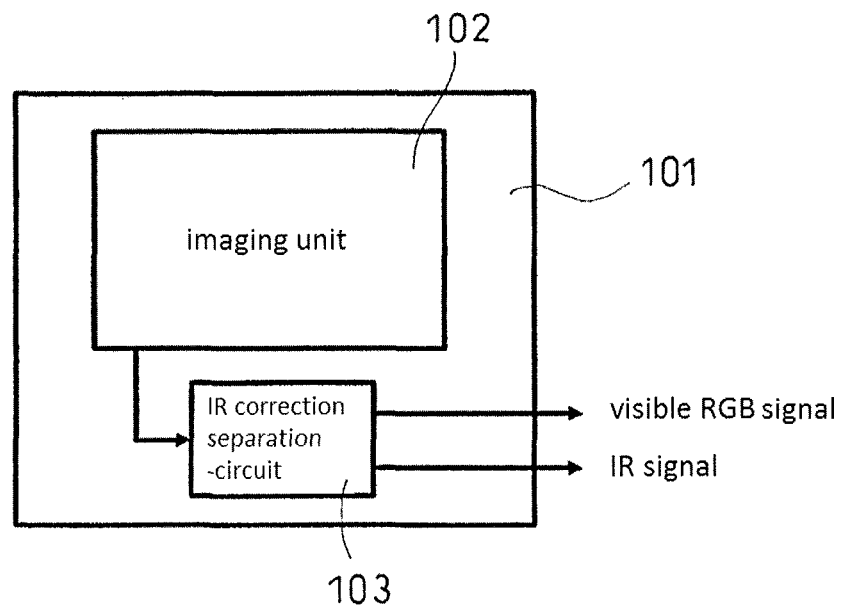
[Fig. 23]
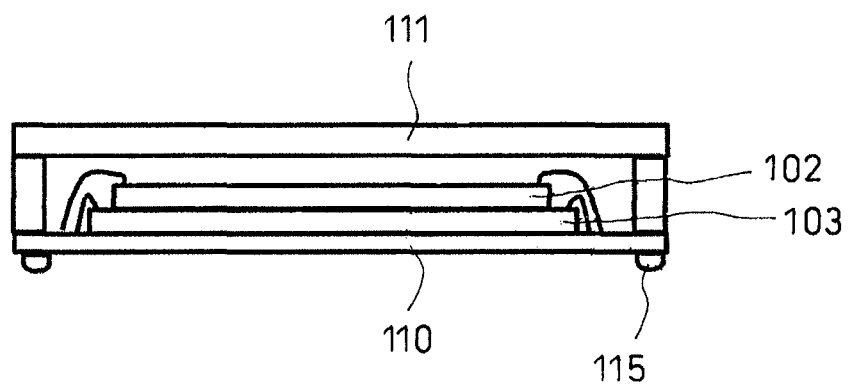

[Fig. 24]
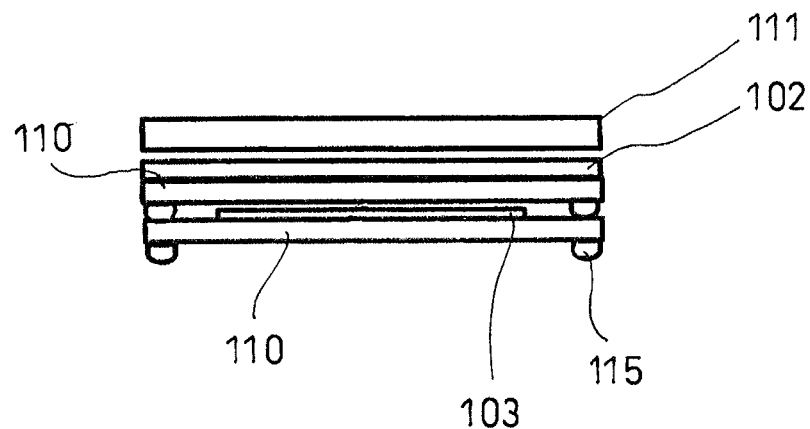
[Fig. 25]
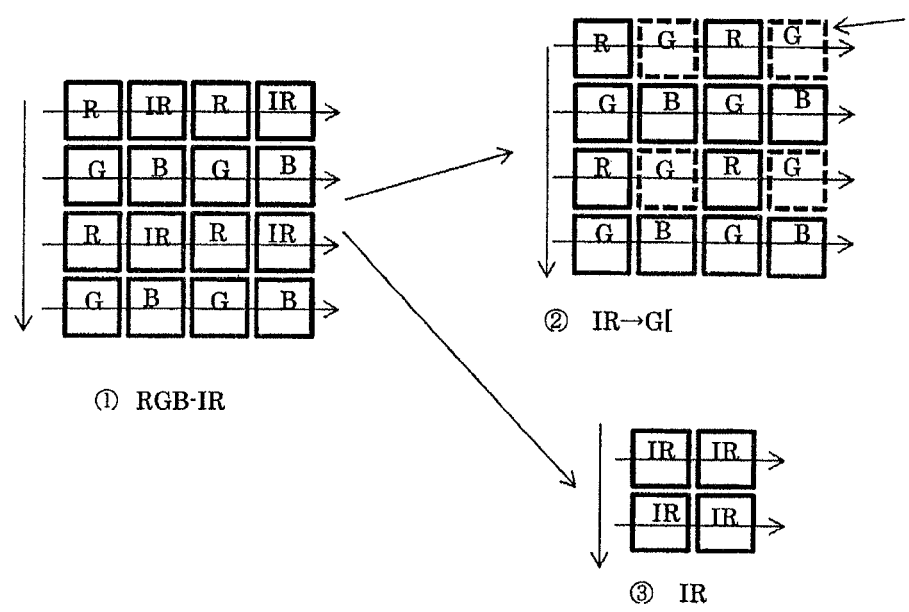

[Fig. 26]
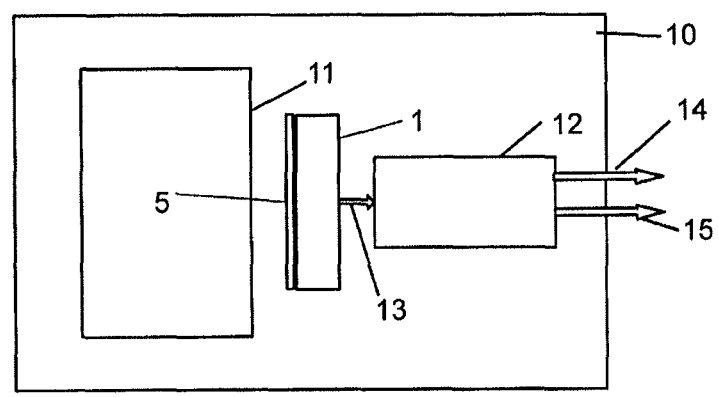
[Fig. 27]
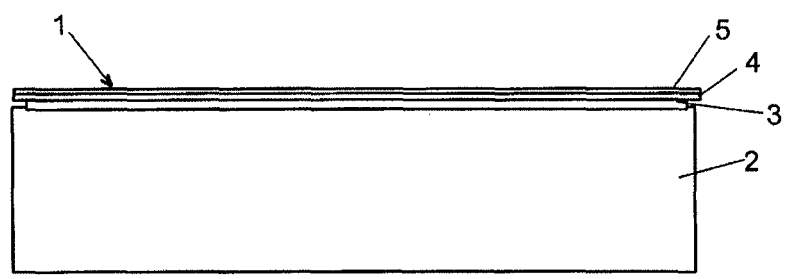

[Fig 28]
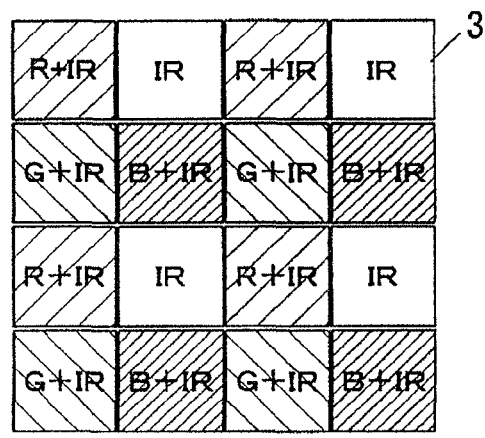
[Fig 29]
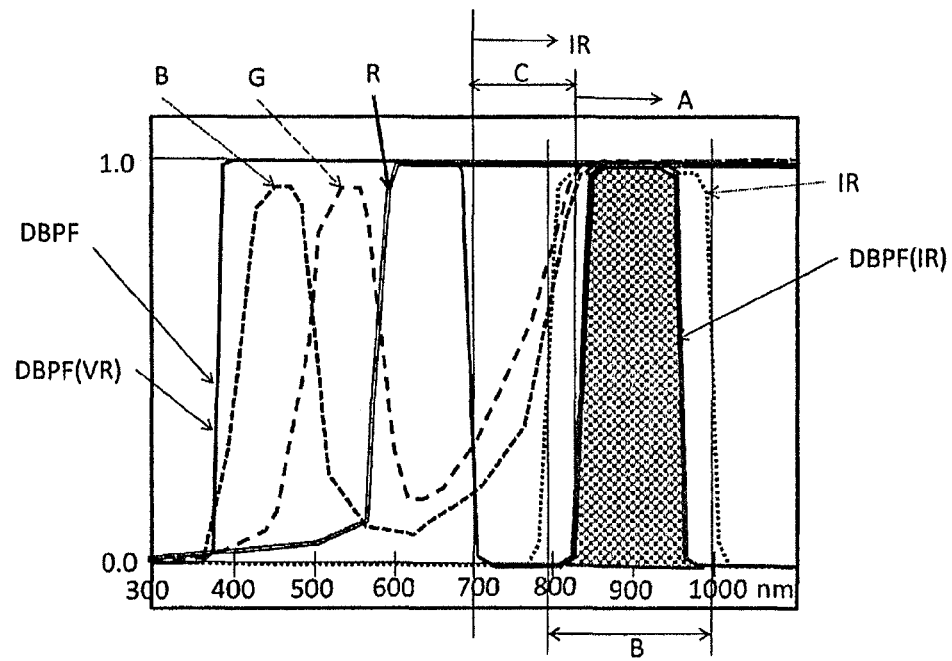

[Fig. 30]
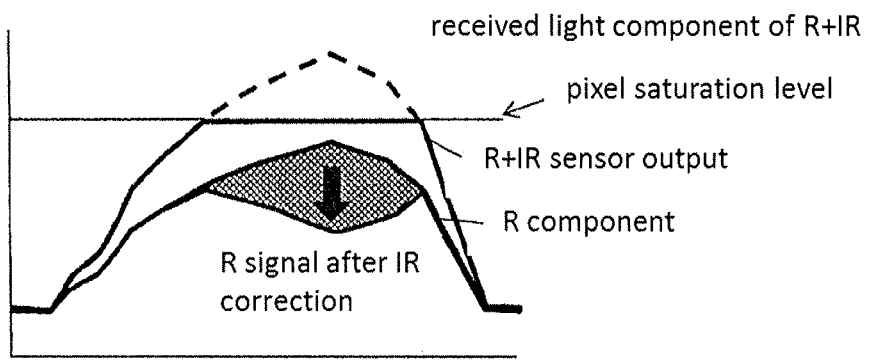
[Fig. 31]
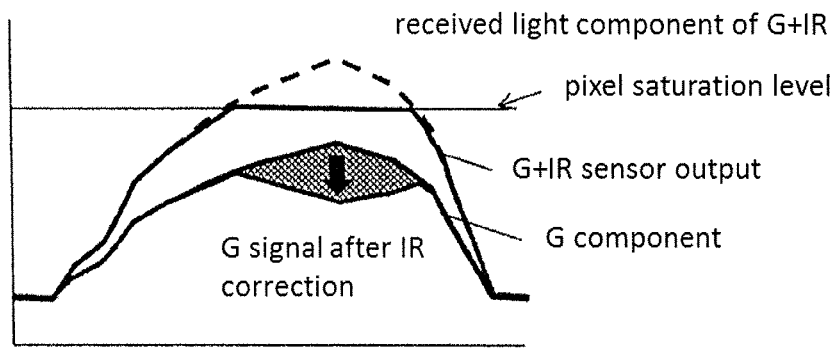
[Fig. 32]
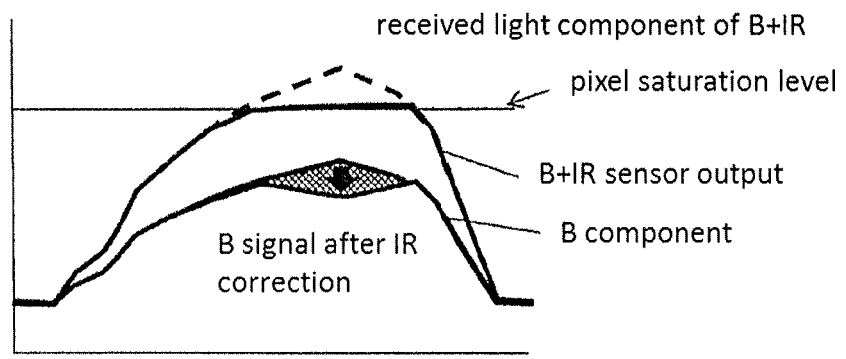

[Fig. 33]
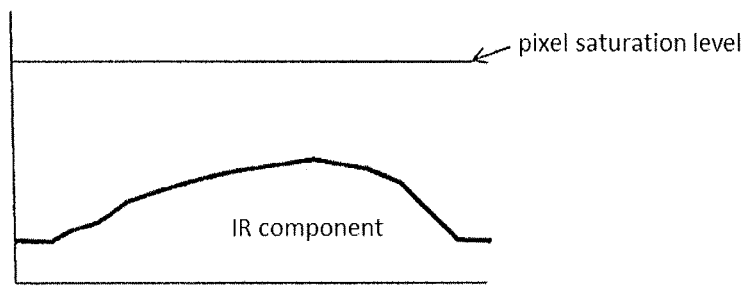
[Fig. 34]
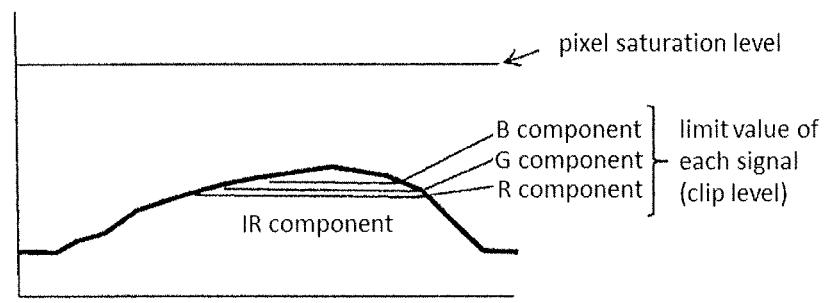

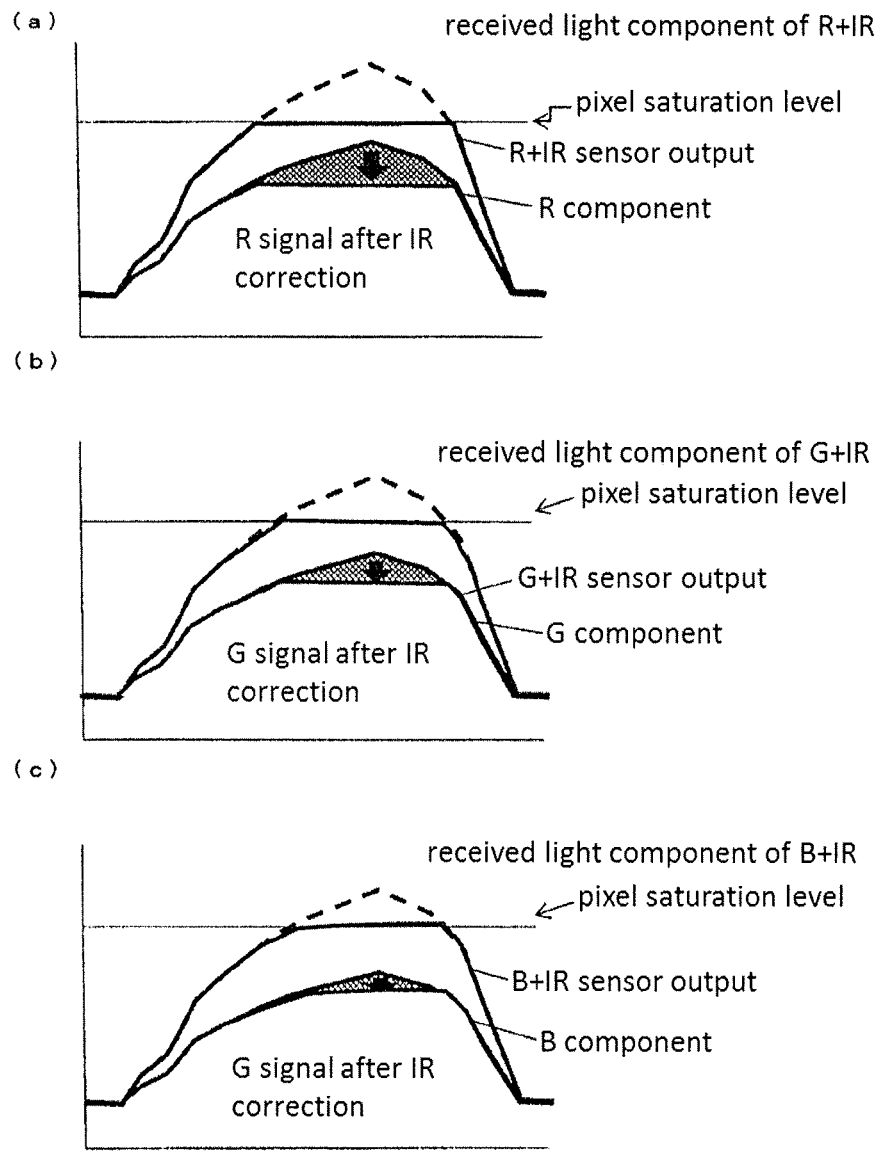
[Fig. 35]

[Fig. 36]
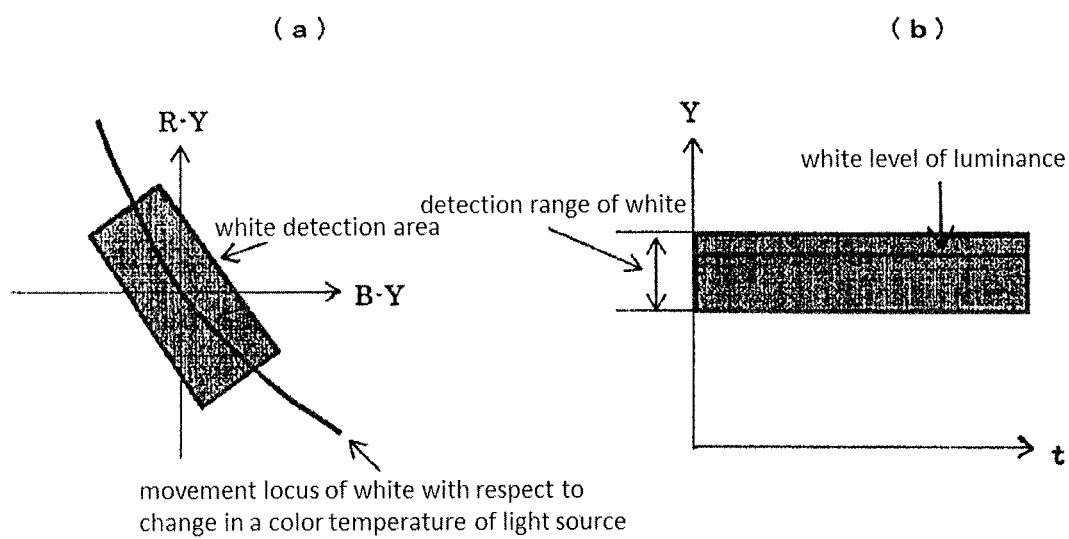

[Fig. 37]
(a)
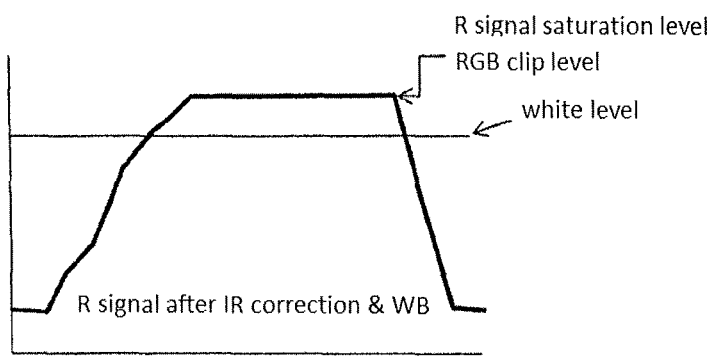
(b)
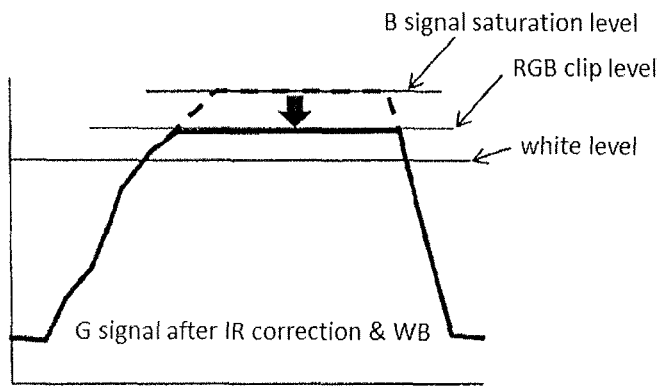
(c)
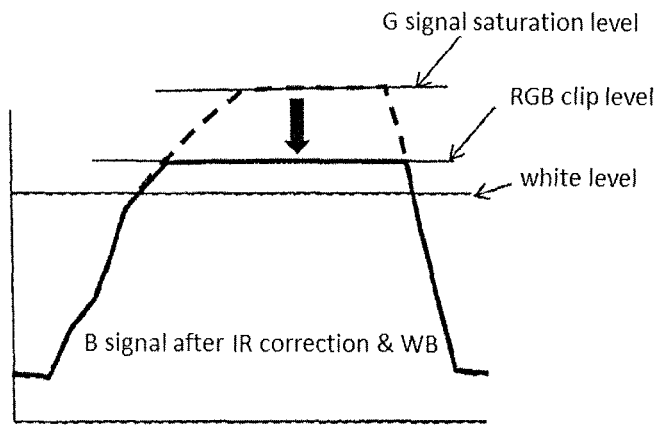

[Fig. 40]
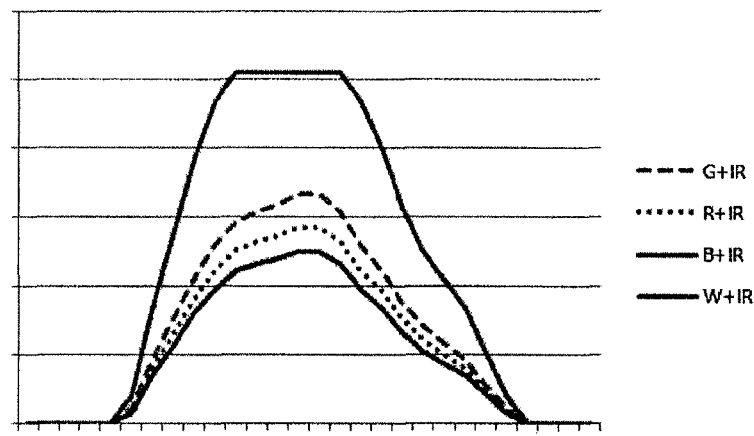
[Fig. 41]
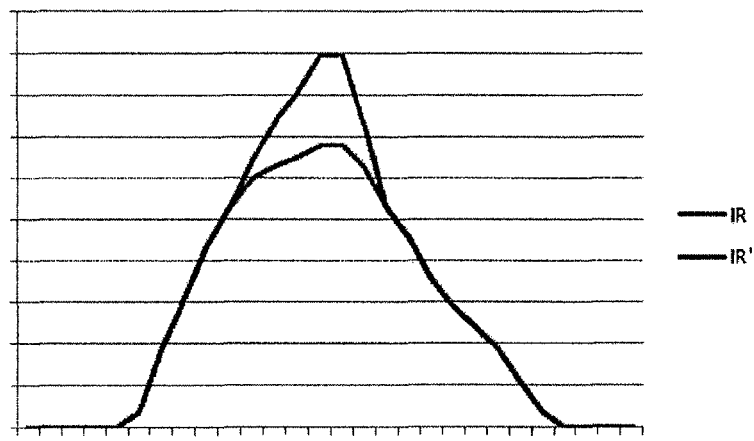

[Fig. 42]
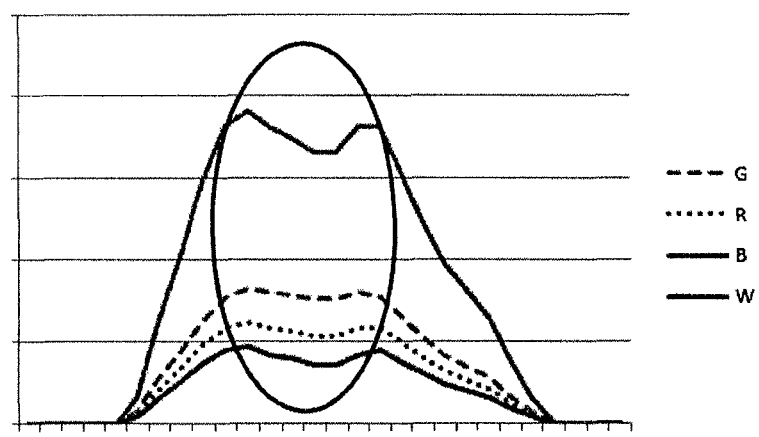
[Fig. 43]
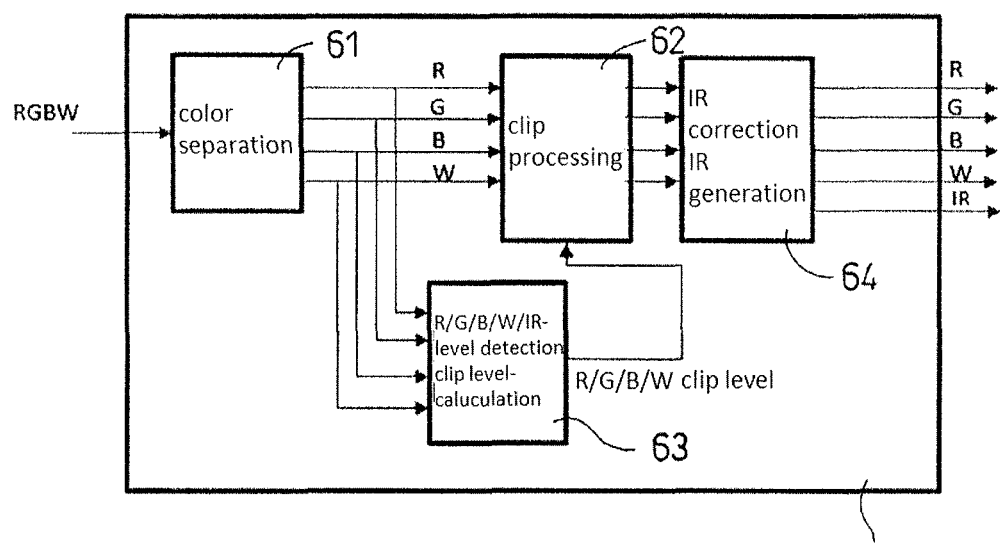

[Fig. 44]
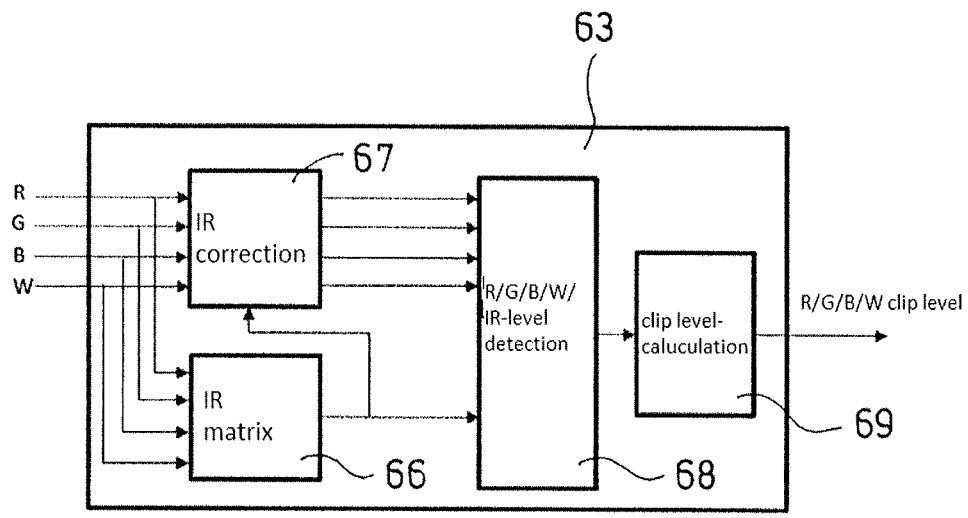
[Fig. 45]
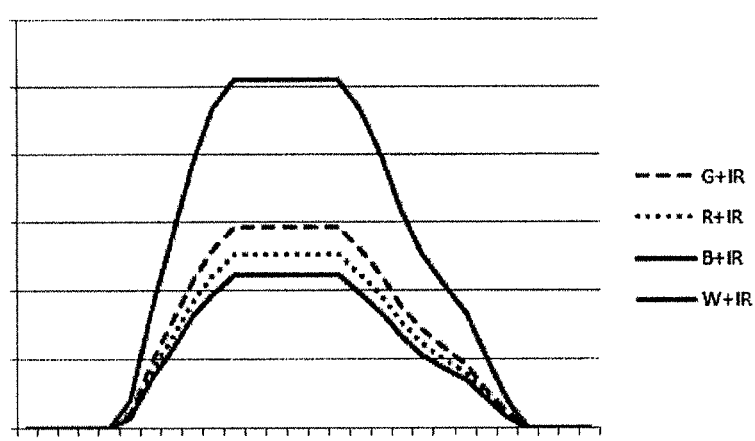

[Fig. 46]
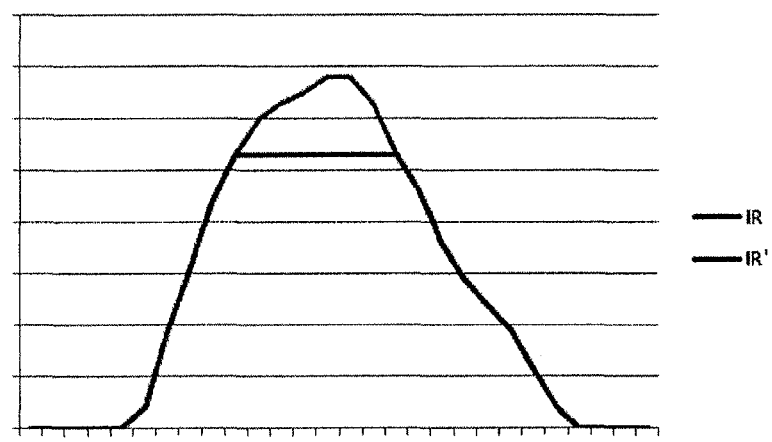
[Fig. 47]
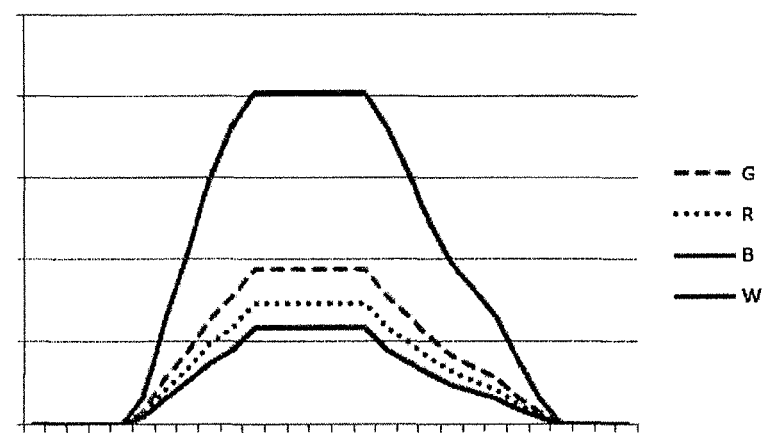

[Fig. 48]
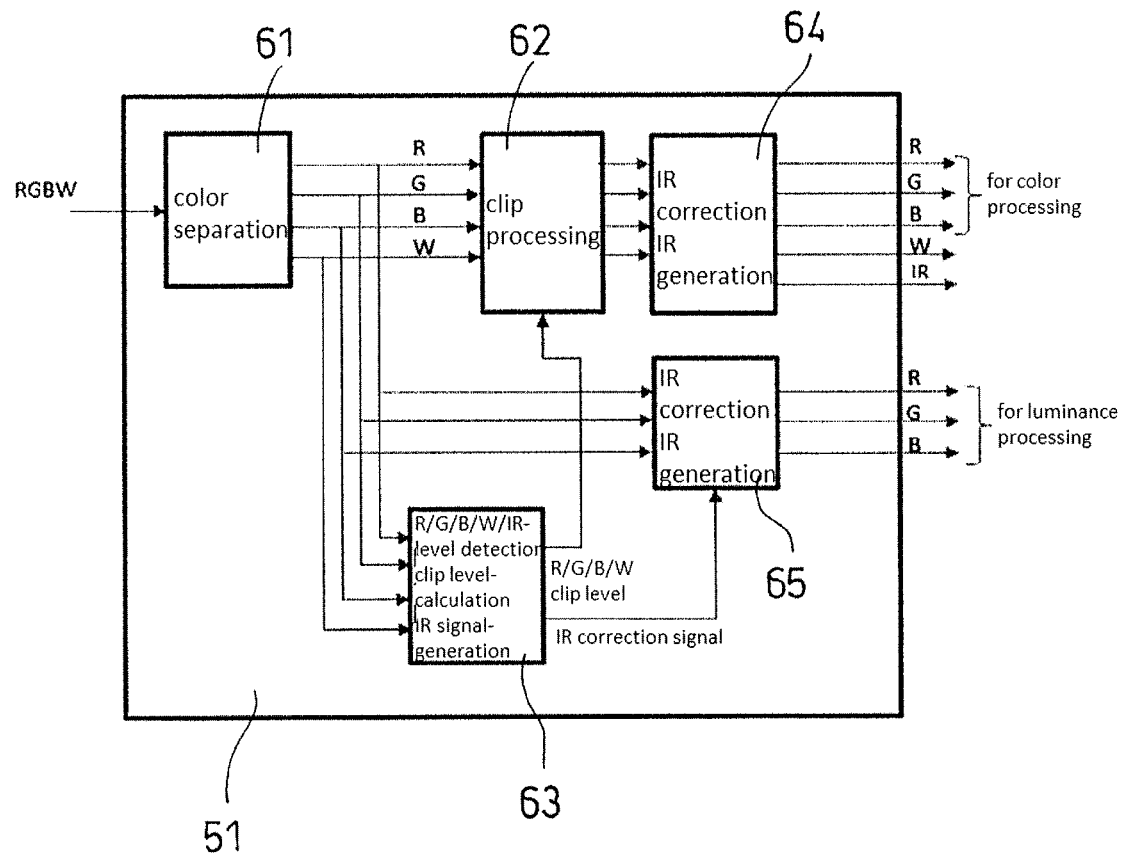
[Fig. 49]
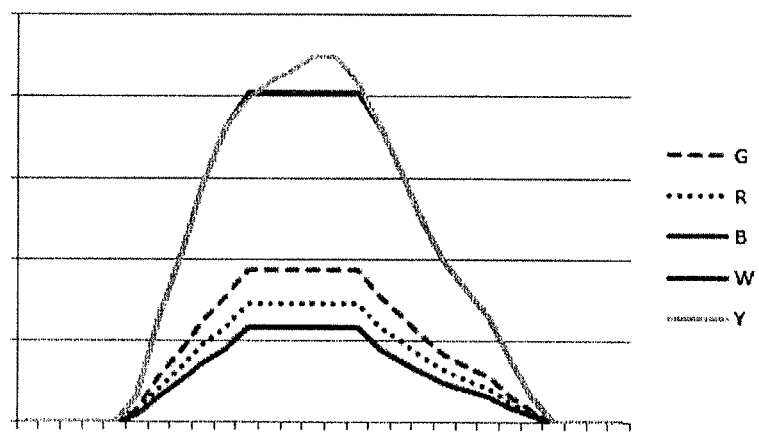

[Fig. 50]
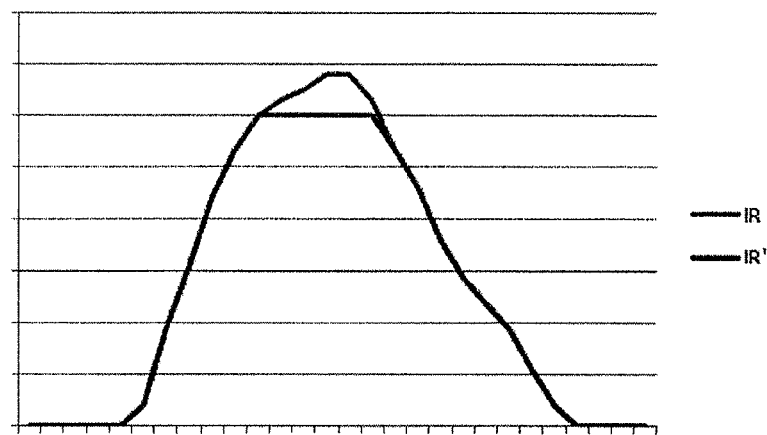
[Fig. 51]
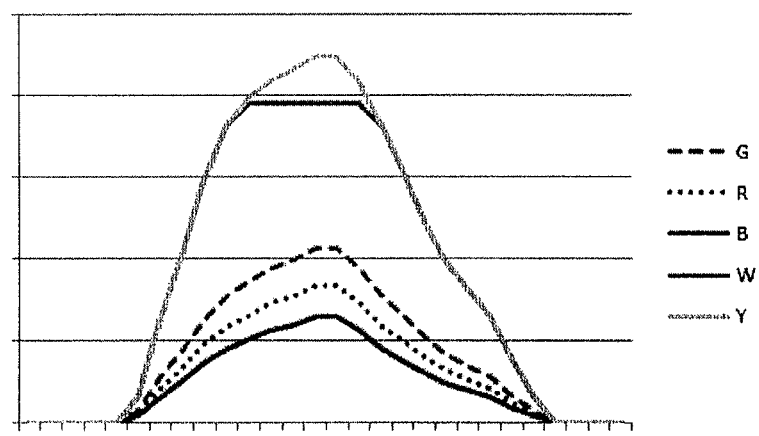

[Fig. 52]
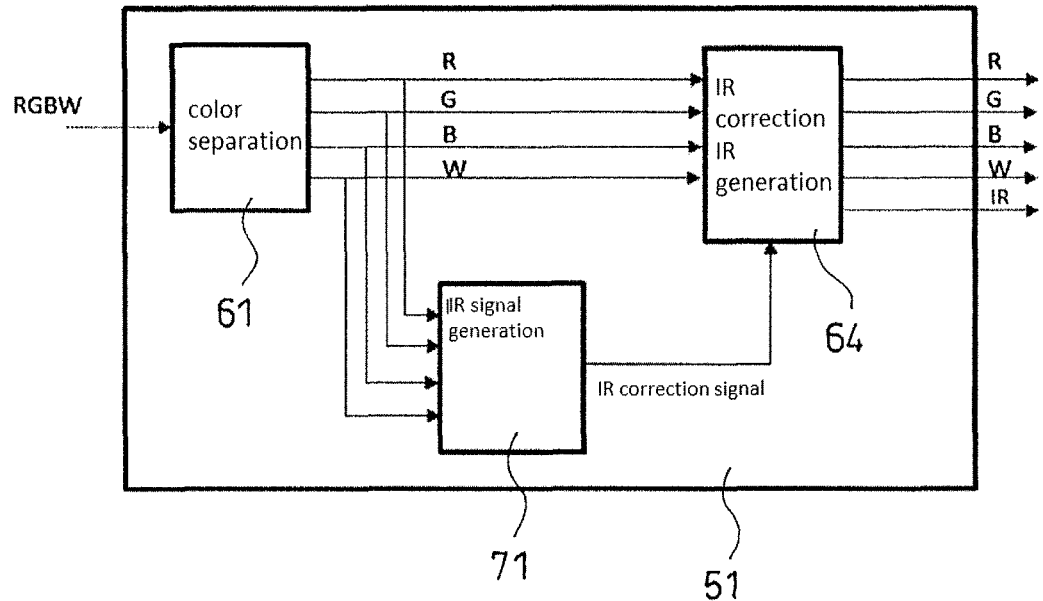
[Fig. 53]
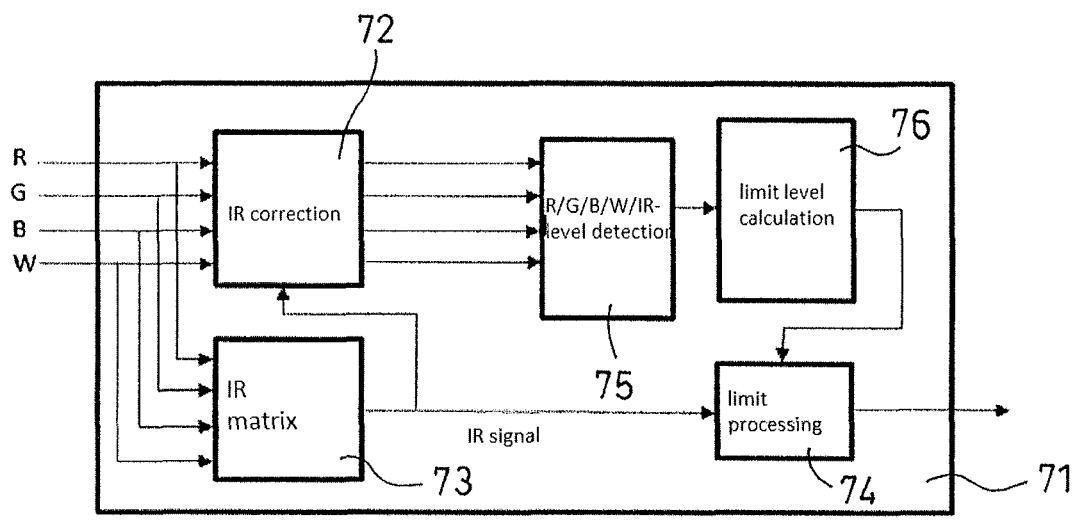

IMAGING SENSOR AND IMAGING DEVICE

TECHNICAL FIELD

The present invention relates to an imaging sensor and an imaging device that perform both of photographing with visible light and photographing with infrared light.

BACKGROUND ART

Conventionally, in an imaging device such as a monitoring camera that continuously performs photographing night and day (hereinafter, simply referred to as imaging device), infrared light is detected and photographing is performed at night. A photodiode that is a light-receiving unit of an imaging sensor such as a CCD sensor or a CMOS sensor can receive light of up to a near-infrared wavelength band around 1300 nm. Thus, an imaging device using these imaging sensors can perform photographing of up to an infrared band in principle.

Note that a wavelength band of light with a high luminosity factor of a human is 400 nm to 700 nm. Thus, when near-infrared light is detected in an imaging sensor, redness is increased in a video seen with a human eye. Thus, in photographing in daytime or in a bright indoor place, it is preferable that an infrared cut filter to block light in an infrared band is provided in front of the imaging sensor and light with a wavelength being 700 nm or longer is removed in order to adjust sensitivity of the imaging sensor to a luminosity factor of a human. On the other hand, in photographing at night or in a dark place, it is necessary to perform photographing without providing the infrared cut filter.

As such an imaging device, an imaging device in which attachment/detachment of an infrared cut filter is performed manually or an imaging device in which an infrared cut filter is inserted/removed automatically is conventionally known. Moreover, in Patent Literature 1, an imaging device in which the above-described insertion/removal of an infrared cut filter is not necessary is disclosed.

Thus, an optical filter that has a transmission characteristic in a visible-light band, a blocking characteristic in a first wavelength band adjacent to a long-wavelength side of the visible-light band, and a transmission characteristic in a second wavelength band that is a part of the first wavelength band has been proposed (see, for example, Patent Literature 1). According to this filter, light can be transmitted in both of the visible-light band and the second wavelength band that is away from the visible-light band on the long-wavelength side, that is, on an infrared side of the visible-light band. For example, the second wavelength band overlaps with a wavelength band of infrared illumination and this filter is an optical filter that makes it possible to perform both of visible light photographing and infrared light photographing at night with infrared-light illumination. In the following, an optical filter that transmits light in a visible-light band and a second wavelength band on an infrared side and that blocks light in the other wavelength band in the above-described manner is referred to as a double bandpass filter (DBPF).

CITATION LIST

Patent Literature

Patent Literature 1: Japanese Patent No. 5009395

SUMMARY OF INVENTION

Technical Problem

Incidentally, in DBPF in Patent Literature 1, light in a second wavelength band included in an infrared (near-infrared) wavelength band (relatively narrow wavelength band included in infrared wavelength band) is not constantly blocked and the light passes. That is, unlike a case where an infrared cut filter that cuts a long-wavelength side of a visible-light band is used, there is more than a little influence of infrared light that passes through the second wavelength band in photographing in the visible-light band.

A color filter is used in an imaging sensor that performs color photographing as photographing in the visible-light band. In the color filter, red, green, and blue regions (filter part) are arranged in a predetermined pattern in a manner corresponding to each pixel of the imaging sensor. Each of these color regions basically has a peak of transmittance of light in a wavelength band of each color and limits (block) transmission of light in a wavelength band of a different color.

However, on the long-wavelength side of the visible-light band, light is basically transmitted although light transmittance is different depending on a region of each color and a wavelength. Thus, when an infrared cut filter is used, there is no problem since light on the long-wavelength side of the visible-light band is cut. However, when infrared light is transmitted in the second wavelength band on the infrared side in a case of DBPF described above, this infrared light passes through a color filter, reaches a photodiode (light-receiving element) of an imaging sensor, and increases a generation amount of electrons by a photoelectric effect in the photo diode.

Here, for example, in a case where both of color photographing with visible light and photographing with infrared-light illumination are performed, a region for infrared light which region has a peak of light transmittance in the above-described second wavelength band (infrared region) is provided in a color filter in which red, green, and blue regions are arranged in a predetermined pattern. That is, an array (pattern) in the color filter includes four regions of red R, green G, blue B, and infrared IR. In this case, since the region for infrared light blocks light in the visible-light band and mainly transmits light in the second wavelength band, it is considered that an infrared component is removed from red, green, and blue image signals by utilization of an image signal of infrared light which signal is output from an imaging sensor that receives light that passes through the region for infrared light in the color filter. However, due to such signal processing, it is difficult to perform color reproduction that is substantially equivalent to that in color photographing in a case where an infrared cut filter is used.

The present invention is provided in view of the forgoing and is to provide an imaging sensor and an imaging device that can improve color reproducibility invisible light photographing in a case where DBPF is used instead of an infrared cut filter.

Solution to Problem

In order to solve the above problem, an imaging sensor of the present invention includes: an imaging sensor main body in which a light-receiving element is arranged in each pixel; and a filter provided on the imaging sensor main body, wherein on the filter, a plurality of kinds of filter regions with different spectral transmission characteristics is arranged in a predetermined array in a manner corresponding to an arrangement of the pixel of the imaging sensor main body, the plurality of kinds of filter regions has different spectral transmission characteristics each of which corresponds to a wavelength in a visible-light band, and each of the plurality of kinds of filter regions has an infrared-light transmission wavelength band, which passes light, on a long-wavelength side of the visible-light band and has a light-blocking wavelength band, which blocks light, between the visible-light band and the infrared-light transmission wavelength band in a mutually similar manner.

According to such a configuration, for example, in a camera that outputs an image signal in a visible-light band corresponding to each of red, green, and blue (RGB) and an image signal in infrared (IR) on a long-wavelength side of the visible-light band, by using a filter including, for example, four kinds of filter regions arranged in a manner corresponding to each pixel, it is possible to remove a component on the long-wavelength side of the visible-light band, which component is included in each filter region, from the image signal in the visible-light band at performance close to that of when an infrared cut filter is used.

That is, in a color filter of a camera that uses an infrared cut filter, a transmission characteristic corresponding to a wavelength on a long-wavelength side of visible light varies depending on a color of each filter part and a color varies due to the different in the transmission characteristic when an uniformly-set infrared component is removed in the filter part in each color. However, when a part, in which a transmission characteristic of a wavelength varies on the long-wavelength side of the visible-light band, in each filter region is blocked by a light-blocking wavelength band, it is possible to control a variation in color even when the uniformly-set infrared component is removed. Note that, for example, in a case where colors are four colors of R, G, B, and IR, when there are four kinds of filter regions with different transmission characteristics corresponding to wavelengths in the visible-light band, it is possible to calculate R, G, B, and IR and to output an image signal in the visible-light band, from which signal an infrared component is removed, and an infrared image signal.

In the configuration of the present invention, it is preferable that the filter includes an optical filter that transmits light in the visible-light band having a first wavelength band that blocks light in a manner adjacent to the long-wavelength side of the visible-light band and that includes the light-blocking wavelength band, and a second wavelength band as the infrared-light transmission wavelength band that transmits light in a manner adjacent to a long-wavelength side of the light-blocking wavelength band in a part away from the visible-light band in the first wavelength band, and a color filter including a plurality of kinds of filter parts which has different spectral transmission characteristics corresponding to the wavelengths in the visible-light band having a third wavelength band of which transmittance is approximate to each other on the long-wavelength side of the visible-light band, and that corresponds to the plurality of kinds of filter regions, and a spectral transmission characteristic of the optical filter and the spectral transmission characteristic of each of the filter parts of the color filter are set in such a manner that the second wavelength band of the optical filter is included in the third wavelength band.

According to such a configuration, an optical filter is used instead of an infrared cut filter in photographing of a visible light image. Since infrared light that passes through a second wavelength band of an optical filter reaches a light-receiving element of each pixel of an imaging sensor main body and increases the number of electrons generated by a photoelectric effect, it is necessary to control an influence of the infrared light, which passes through the optical filter, by processing an image signal.

In this case, for example, when the colors are red, green, and blue, transmittance of a red filter part is substantially the maximum in a boundary part between a visible-light band and an infrared band and the transmittance is substantially the maximum on a long-wavelength side thereof. Also, in each of green and blue filter parts, transmittance is low in the boundary between the visible-light band and the infrared band. However, the transmittance becomes higher as a wavelength becomes longer than the visible-light band and finally becomes substantially the maximum. The transmittance is also substantially the maximum on a long-wavelength side of the wavelength at which the transmittance becomes substantially the maximum.

In this case, in an infrared band adjacent to the visible-light band, that is, a region in which a wavelength of an infrared band is short, the transmittance of the blue and green filter parts is greatly different from that of the red filter part with the maximum transmittance and the transmittance varies between blue and green. Also, in each of the blue and green filter parts, transmittance trends become higher toward the long-wavelength side and the transmittance varies depending on a wavelength until the transmittance becomes substantially the maximum. Thus, in a case where a wavelength band of this part is included in the second wavelength band, it is difficult to prevent infrared light that passes through a second wavelength low region from influencing a visible image. That is, in a case of correcting red, green, and blue image signals based on light, which passes through the red, green, and blue filter parts, by using an infrared image signal based on light that passes through the infrared filter part, it is not possible to calculate signals, which are subtracted from the red, green, and blue image signals, from the infrared image signal based on the light that passes through the infrared filter and it becomes difficult to improve color reproducibility.

Since the transmittance of the red, green, and blue filter parts becomes substantially the maximum in the second wavelength band of the optical filter part, when the second wavelength band is included in a third wavelength band in which the transmittance of the red, green, and blue filter parts is substantially approximate to each other, transmittance of light that passes through the second wavelength band and that passes through the red, green, and blue filter parts becomes substantially the same in the red, green, and blue filter parts. That is, a wavelength band in which the transmittance varies greatly in the red, green, and blue filter parts overlaps with a wavelength band with a blocking characteristic between the visible-light band, which has a transmission characteristic, and the second wavelength band in the optical filter.

Accordingly, light in the wavelength band in which transmittance varies greatly depending on a color of a filter part cannot pass through the optical filter. On an infrared side, light in a wavelength band in which the transmittance is approximate in the red, green, and blue filter parts can pass through the optical filter.

Note that the filter parts are not limited to red, green, blue, and infrared and a filter part in a different color may be used. For example, color in the visible-light band other than red, green, and blue, white (clear (C) or white (W)) to transmit light in substantially a whole wavelength band in the visible-light band, or the like may be used instead of infrared. Also, different colors may be used as red, green, and blue.

Also, white may be one in which transmittance of light is lowered in an almost similar manner in the whole visible-light band.

In the configuration of the present invention, in the third wavelength band, it is preferable that a difference in transmittance of the filter parts in the colors is 20% or smaller in the transmittance.

According to such a configuration, it becomes possible to control an influence on a visible image by the infrared light passing through the second wavelength band of the optical filter as described above and it is possible to improve color reproducibility. Basically, it is preferable that transmittance of the filter parts in the colors is substantially identical to each other. However, the above-described image processing of controlling an influence of infrared light can be performed when a difference is 10% or smaller in the transmittance. Note that a state in which a difference in transmittance becomes 10% or smaller in transmittance is a case where a difference in transmittance of when the lowest transmittance (%) is subtracted from the highest transmittance in the filter parts in the colors in the second wavelength band becomes equal to or smaller than 20%. Note that a difference in the transmittance is preferably 10% or smaller.

Also, in the configuration of the present invention, four or more kinds of the filter regions each of which has a transmission characteristic in a limited wavelength band corresponding to each color in the visible-light band, a transmission characteristic in substantially a whole wavelength band in the visible-light band, or a blocking characteristic in substantially the whole wavelength band in the visible-light band are preferably included.

According to such a configuration, in addition to red, green, and blue, an infrared filter having a blocking characteristic in substantially the whole wavelength band in the visible-light band, or a white (clear) filter having a transmission characteristic in substantially the whole wavelength band in the visible-light band can be used. Also, a filter in color other than red, green, and blue can be used. Also, red, green and blue filters may have different colors. Accordingly, a degree of freedom in designing of a color filter becomes high and various kinds of designing become possible.

Also, in the configuration of the present invention, it is preferable that the color filter includes four or more kinds of the filter parts corresponding to four or more kinds of different colors, one kind of the filter parts has a blocking characteristic in substantially the whole visible-light band and has a transmission characteristic in a fourth wavelength band on the long-wavelength side of the visible-light band, and a transmission characteristic of the optical filter and a transmission characteristic of each of the filter parts of the color filter are set in such a manner that the second wavelength band of the optical filter is included in the third wavelength band and the fourth wavelength band.

According to such a configuration, it is possible to calculate an infrared component by using an infrared filter part having a blocking characteristic in substantially the whole wavelength region in the visible-light band. Also, the fourth wavelength band that is a wavelength band, which has a transmission characteristic, of the infrared filter part has a part that overlaps with the third wavelength band. The second wavelength band of the optical filter is included in both of the third wavelength band and the fourth wavelength band. Accordingly, in a case of eliminating an influence of infrared light that passes through the second wavelength band by image processing, it becomes possible to calculate signals, which are subtracted from red, green and blue image signals, by using an infrared image signal that is based on light passing through the infrared filter part and it becomes possible to improve color reproducibility by controlling an influence of the infrared light that passes through the second wavelength band of the optical filter. That is, when it is assumed that the same quantity of infrared light in the same wavelength band enters each pixel, quantity of light that passes through the second wavelength band and passes through the red, green, blue, and infrared filter parts does not vary greatly depending on a filter part and becomes substantially the same. Thus, in this case, it is possible to remove light quantity based on the infrared light by subtracting quantity of the light that passes through the infrared filter part from quantity of the light that passes through the red, green and blue filter parts.

Also, in the configuration of the present invention, it is assumed that infrared illumination is used in imaging of an infrared image, and setting is preferably performed in such a manner that a fifth wavelength band, which is a wavelength band of infrared light emitted from the infrared illumination, is included in the third wavelength band and the fourth wavelength band and that the second wavelength band of the optical filter substantially overlaps with the fifth wavelength band.

According to such a configuration, it is possible to make a wavelength band of infrared light of the infrared illumination and the second wavelength band of the optical filter substantially the same. Also, the infrared light of the infrared illumination can be efficiently used mainly in a case where photographing of an infrared image is performed at night by utilization of the infrared illumination. Also, in a case where a wavelength band of infrared light of the infrared illumination is narrow, it is possible to narrow down the second wavelength band of the optical filter in accordance therewith. In this case, it is possible to reduce an influence of infrared light, which passes through the second wavelength band, with respect to a visible image.

Also, in the configuration of the present invention, it is preferable that in the color filter, four each of four kinds of the filter parts of red, blue, and green with transmission characteristics in limited wavelength bands corresponding to the colors in the visible-light band and of infrared with a blocking characteristic in substantially a whole wavelength band in the visible-light band are arranged in a basic array with four rows and four columns, the same kinds of filter parts are arranged separately in such a manner as not to be adjacent to each other in a row direction and a column direction, one each of the red, blue, green and infrared filter parts are arranged in each column, and two each of two kinds of the filter parts among the red, blue, green, and infrared filter parts are arranged in every other row.

According to such a configuration, in the color filter, the red, blue, green, and infrared filter parts are arranged in substantially an even manner. In this case, it is not possible to use high sensitivity of a human eye with respect to green. However, the filter parts in the colors are arranged in substantially an even manner and interpolation processing becomes easy. Also, in this color filter, one each of the red, blue, green, and infrared filter parts are arranged in each column and two each of two kinds of the filter parts among the red, blue, green, and infrared filter parts are arranged in every other row. Thus, resolution in the row direction is higher than that in the column direction. Note that it is preferable that the row direction is a horizontal direction and the column direction is a vertical direction.

Also, in the configuration of the present invention, it is preferable that in the color filter, eight green filter parts, four red filter parts, two blue filter parts and infrared filter parts among four kinds of the filter parts of red, blue, and green with transmission characteristics in limited wavelength bands corresponding to colors in the visible-light band and of infrared with a blocking characteristic in substantially a whole wavelength band in the visible-light band are arranged in a basic array with four rows and four columns, and the same kinds of filter parts are arranged separately in such a manner as not to be adjacent to each other in a row direction and a column direction.

According to such a configuration, resolution of blue is lower than that in a color filter in the Bayer array with no infrared filter part. However, resolution of green and red can be held. In this case, there is priority on green and luminance based on green.

Also, in the configuration of the present invention, it is preferable that in the color filter, eight green filter parts, four infrared filter parts, two red filter parts and blue filter parts among four kinds of the filter parts of red, blue, and green with transmission characteristics in limited wavelength bands corresponding to colors in the visible-light band and of infrared with a blocking characteristic in substantially a whole wavelength band in the visible-light band are arranged in a basic array with four rows and four columns, and the same kinds of filter parts are arranged separately in such a manner as not to be adjacent to each other in a row direction and a column direction.

According to such a configuration, resolution of red and blue is lower than that in a color filter in the Bayer array with no infrared filter part. However, resolution of green can be held. Also, resolution of infrared becomes higher than that of blue or red and it is possible to secure resolution of an infrared image.

Also, in the configuration of the present invention, a signal separating/outputting device to separate a signal, which is sequentially input from each pixel of the imaging sensor main body, into an image signal in the visible-light band, from which signal a signal in a wavelength band on the long-wavelength side of the visible-light band is removed, and an infrared image signal on the long-wavelength side of the visible-light band and to perform an output thereof is preferably included.

According to such a configuration, since it is possible to output an image signal similar to that from a conventional imaging sensor to output an image signal in a visible-light band, it is possible to use an imaging sensor of the present invention only by adding a processing circuit of an infrared image signal without changing a processing circuit of an image signal in and after the imaging sensor. Accordingly, it becomes easy to introduce the imaging sensor of the present invention. For example, it is possible to easily introduce a photographing function of an infrared image at low cost into a smartphone, an electronic camera, or a different device into which a camera mechanism is embedded.

An imaging device of the present invention preferably includes: the imaging sensor; an optical system including a lens to form an image on the imaging sensor; and a signal processing device that can process a signal output from the imaging sensor and can output a visible image signal and an infrared image signal.

According to such a configuration, an effect of the above-described imaging device can be acquired. Thus, it is possible for the signal processing device to perform processing of eliminating an influence of infrared light, which passes through a second wavelength band of an optical filter, in a visible image.

Also, an imaging device of the present invention includes: an imaging sensor including an imaging sensor main body in which a light-receiving element is arranged in each pixel and a color filter in which a plurality of kinds of filter parts is arranged in a predetermined array in a manner corresponding to an arrangement of the pixel of the imaging sensor main body, the plurality of kinds of filter parts having different transmission characteristics corresponding to wavelengths in a visible-light band; an optical system including a lens to form an image on the imaging sensor; an optical filter that is provided in the optical system and that has a transmission characteristic in the visible-light band, a blocking characteristic in a first wavelength band adjacent to a long-wavelength side of the visible-light band, and a transmission characteristic in a second wavelength band that is a part of the first wavelength band; and a signal processing device that can process a signal output from the imaging sensor and can output a visible image signal and an infrared image signal, wherein a transmission characteristic of the optical filter and the transmission characteristic of each of the filter parts of the color filter are set in such a manner that the second wavelength band of the optical filter is included in a third wavelength band that is a wavelength band in which transmittance of the filter parts in colors is approximate to each other on the long-wavelength side of the visible-light band.

According to such a configuration, in the above-described imaging device, an optical filter is provided not in an imaging sensor but in an optical system. However, an optical characteristic of the optical filter or a color filter is similar to that of the above-described imaging device and an effect similar to that of the above-described imaging device can be acquired.

In the configuration of the imaging device of the present invention, it is preferable that a difference in the transmittance of the filter parts in the colors is 10% or smaller in the transmittance in the third wavelength band.

According to such a configuration, it becomes possible to control an influence on a visible image by the infrared light passing through the second wavelength band of the optical filter as described above and it is possible to improve color reproducibility. Basically, it is preferable that transmittance of the filter parts in the colors is substantially identical to each other. However, the above-described image processing of controlling an influence of infrared light can be performed when a difference is 10% or smaller in the transmittance.

Also, in the configuration of the imaging device of the present invention, the color filter preferably includes four or more kinds of the filter parts each of which has a transmission characteristic in a limited wavelength band corresponding to each color in the visible-light band, a transmission characteristic in substantially a whole wavelength band in the visible-light band, or a blocking characteristic in substantially the whole wavelength band in the visible-light band.

According to such a configuration, in addition to red, green, and blue, an infrared filter having a blocking characteristic in substantially the whole wavelength band in the visible-light band, or a white (clear) filter having a transmission characteristic in substantially the whole wavelength band in the visible-light band can be used. Also, a filter in color other than red, green, and blue can be used. Also, red, green and blue filters may have different colors. Accordingly, a degree of freedom in designing of a color filter becomes high and various kinds of designing become possible.

Also, in the configuration of the imaging device of the present invention, it is preferable that the color filter includes four or more kinds of the filter parts corresponding to four or more kinds of different colors, one kind of the filter parts has a blocking characteristic in substantially the whole visible-light band and has a transmission characteristic in a fourth wavelength band on the long-wavelength side of the visible-light band, and a transmission characteristic of the optical filter and a transmission characteristic of each of the filter parts of the color filter are set in such a manner that the second wavelength band of the optical filter is included in the third wavelength band and the fourth wavelength band.

According to such a configuration, in a case of eliminating an influence of infrared light that passes through the second wavelength band by image processing, it becomes possible to calculate signals, which are subtracted from red, green and blue image signals, by using an infrared image signal that is based on light passing through the infrared filter part and it becomes possible to improve color reproducibility by controlling an influence of the infrared light that passes through the second wavelength band of the optical filter. That is, when it is assumed that the same quantity of infrared light in the same wavelength band enters each pixel, quantity of light that passes through the second wavelength band and passes through the red, green, blue, and infrared filter parts does not vary greatly depending on a filter part and becomes substantially the same. Thus, in this case, it is possible to remove light quantity based on the infrared light by subtracting quantity of the light that passes through the infrared filter part from quantity of the light that passes through the red, green and blue filter parts.

Also, in the configuration of the imaging device of the present invention, it is assumed that infrared illumination is used in imaging of an infrared image, and setting is preferably performed in such a manner that a fifth wavelength band, which is a wavelength band of infrared light emitted from the infrared illumination, is included in the third wavelength band and the fourth wavelength band and that the second wavelength band of the optical filter substantially overlaps with the fifth wavelength band.

According to such a configuration, it is possible to make a wavelength band of infrared light of the infrared illumination and a wavelength band of the optical filter substantially the same. Also, the infrared light of the infrared illumination can be efficiently used mainly in a case where photographing of an infrared image is performed at night by utilization of the infrared illumination. Also, in a case where a wavelength band of infrared light of the infrared illumination is narrow, it is possible to narrow down the second wavelength band of the optical filter in accordance therewith. In this case, it is possible to reduce an influence of infrared light, which passes through the second wavelength band, with respect to a visible image.

Advantageous Effects of Invention

According to an imaging sensor and an imaging device of the present invention, it is possible to control an influence of infrared light that passes through a second wavelength band in a visible light image by image processing in a case of making it possible to perform photographing of a visible light image and an infrared image with an optical filter having a transmission characteristic in a visible-light band and a second wavelength band on an infrared side thereof.

BRIEF DESCRIPTION OF DRAWINGS

FIG. 1 is a schematic view illustrating a first embodiment of the present invention and illustrating an imaging sensor.

FIG. 2 is a graph illustrating the same and illustrating transmittance spectrums of DBPF and a color filter of the imaging sensor.

FIG. 3 is a graph illustrating the same and illustrating transmittance spectrums of DBPF and the color filter of the imaging sensor and an emission spectrum of infrared illumination.

FIG. 4 is a graph illustrating the same and illustrating transmittance spectrums of DBPF and the color filter of the imaging sensor and an emission spectrum of the infrared illumination.

FIG. 5($a$) to FIG. 5($d$) are views illustrating the same and for describing an array in the color filter of the imaging sensor, FIG. 5($a$) being a view illustrating a conventional array with no infrared filter part, and FIG. 5 ($b$), FIG. 5($c$), and FIG. 5($d$) being views illustrating arrays with an infrared filter part.

FIG. 6 is a schematic view illustrating the same and illustrating an imaging device including the imaging sensor.

FIG. 7 is a block diagram illustrating the same and for describing signal processing in a signal processing unit of the imaging device.

FIG. 8 is a view illustrating the same and for describing internal processing in signal processing by the imaging device.

FIG. 9 is a schematic view illustrating an imaging device of a second embodiment of the present invention.

FIG. 10 is a view for describing an array in a color filter of an imaging sensor of a third embodiment of the present invention.

FIG. 11 is a graph illustrating the same and illustrating transmittance spectrums of DBPF and the color filter of the imaging sensor.

FIG. 12 is a view illustrating the same and for describing an array in the color filter of the imaging sensor.

FIG. 13 is a view illustrating the same and for describing an array in the color filter.

FIG. 14 is a view illustrating the same and for describing an array in the color filter.

FIG. 15 is a chart illustrating the same and for describing a characteristic of each color filter.

FIG. 16 is a block diagram illustrating the same and for describing signal processing in the imaging device.

FIG. 17 is a view for describing an array in a color filter of a fourth embodiment of the present invention.

FIG. 18 is a graph illustrating the same and illustrating transmittance spectrums of DBPF and a color filter of blue B of the imaging sensor.

FIG. 19 is a graph illustrating the same and illustrating transmittance spectrums of DBPF and a color filter of green G of the imaging sensor.

FIG. 20 is a graph illustrating the same and illustrating transmittance spectrums of DBPF and a color filter of red R of the imaging sensor.

FIG. 21 is a graph illustrating the same and illustrating transmittance spectrums of DBPF and a color filter of clear C of the imaging sensor.

FIG. 22 is a block diagram illustrating an imaging sensor of a fifth embodiment of the present invention.

FIG. 23 is a sectional view illustrating the same and illustrating the imaging sensor.

FIG. 24 is a sectional view illustrating the same and illustrating a different example of the imaging sensor.

FIG. 25 is a view illustrating the same and for describing an output of image signals in two systems by the imaging sensor.

FIG. 26 is a block diagram illustrating an imaging device of a sixth embodiment of the present invention.

FIG. 27 is a schematic view illustrating the same and illustrating an imaging sensor.

FIG. 28 is a view illustrating the same and for describing an array pattern in a color filter having an infrared region.

FIG. 29 is a graph illustrating the same and illustrating transmittance spectrums of DBPF and the color filter of the imaging sensor.

FIG. 30 is a graph illustrating the same and of an R signal for describing a reason why luminance is decreased in a highlight part.

FIG. 31 is a graph illustrating the same and of a G signal for describing a reason why luminance is decreased in a highlight part.

FIG. 32 is a graph illustrating the same and of a B signal for describing a reason why luminance is decreased in a highlight part.

FIG. 33 is a graph illustrating the same and of an IR signal for describing a reason why luminance is decreased in a highlight part.

FIG. 34 is a graph illustrating the same and illustrating a clip level, of the IR signal, corresponding to each of the color signals of RGB.

FIG. 35(a) to FIG. 35(c) are graphs illustrating the same and for describing subtraction of a clipped IR signal from each of the color signals of RGB, FIG. 35 (a) being a graph illustrating a case of the R signal, FIG. 35(b) being a graph illustrating a case of the G signal, and FIG. 35 (c) being a graph illustrating a case of the B signal.

FIG. 36(a) and FIG. 36(b) are views illustrating the same and for describing white-balance processing, FIG. 36(a) being a view illustrating a region set to be white on a plane of an R-Y signal and a B-Y signal, and FIG. 36(b) being a view illustrating a range of a luminance level set to be white.

FIG. 37(a) to FIG. 37 (c) are graphs illustrating the same and for describing a method of adjusting output levels of clipping RGB signals after subtraction of an IR signal.

FIG. 40 is a graph for describing a saturation level of an RGBC color filter of a seventh embodiment of the present invention.

FIG. 41 is a graph illustrating the same and for describing that a signal level of an IR signal acquired by calculation becomes higher than that of an actual IR signal.

FIG. 42 is a graph illustrating the same and of RGBC signals for describing a reason why luminance is decreased in a highlight part.

FIG. 43 is a block diagram illustrating the same and for describing a separation device.

FIG. 44 is a block diagram illustrating the same and for describing a clip-level calculation device.

FIG. 45 is a graph illustrating the same and for describing clip levels of the RGBC signals.

FIG. 46 is a graph illustrating the same and for describing a clip level of the IR signal.

FIG. 47 is a graph illustrating the same and for describing clip levels of the RGBC signals.

FIG. 48 is a block diagram illustrating the same and for describing a separation device.

FIG. 49 is a graph illustrating the same and for describing clip processing of RGBCY signals.

FIG. 50 is a graph for describing a clip level of an IR signal of an eighth embodiment of the present invention.

FIG. 51 is a graph illustrating the same and for describing clip processing of RGBCY signals.

FIG. 52 is a block diagram illustrating the same and for describing a separation device.

FIG. 53 is a block diagram illustrating the same and for describing an IR signal generation device.

DESCRIPTION OF EMBODIMENTS

Figure 38:
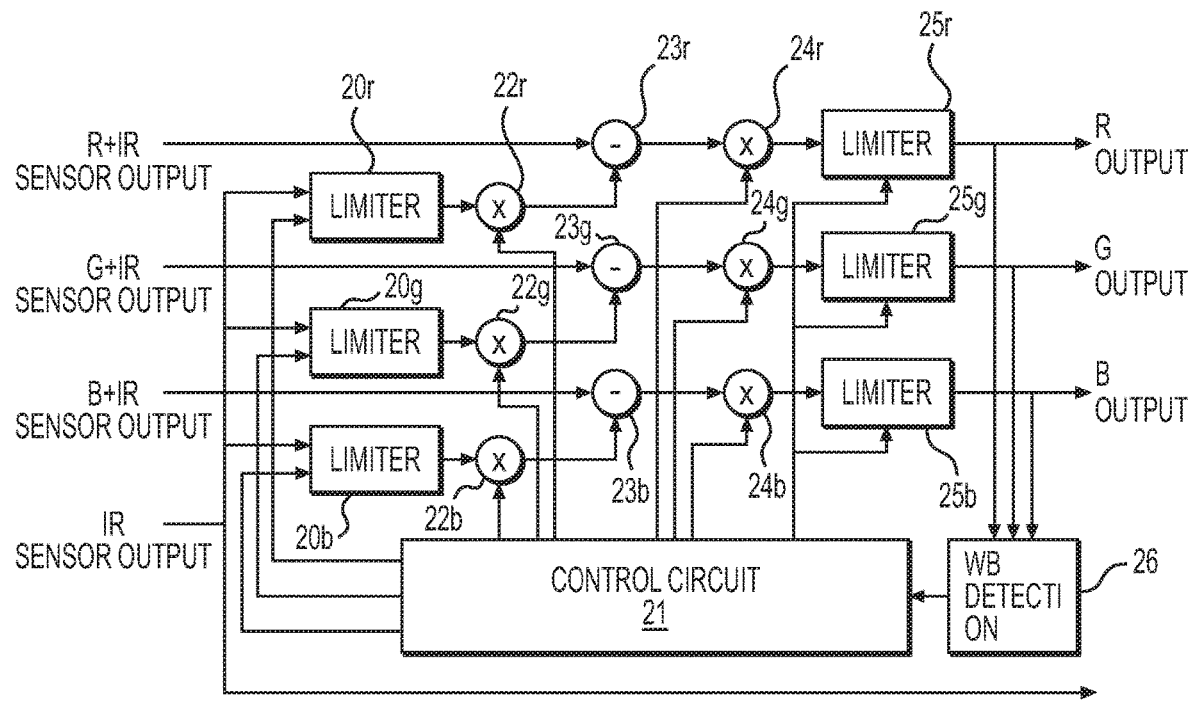
FIG. 38 is a block diagram illustrating the same and illustrating a signal processing unit of an imaging processing device.

In the following, a first embodiment of the present invention will be described with reference to the drawings.

As illustrated in FIG. 1, an imaging sensor (image sensor) 1 of the present embodiment includes, for example, a sensor main body 2 that is a charge coupled device (CCD) image sensor, a color filter 3 in which each of regions of red (R), green (G), blue (B), and infrared (IR) (filter of each color) is arranged in a predetermined array in a manner corresponding to each pixel of the sensor main body 2, a cover glass 4 that covers the sensor main body 2 and the color filter 3, and a double band pass filter (DBPF) 5 formed on the cover glass 4.

The sensor main body 2 is a CCD image sensor. A photodiode as a light-receiving element is arranged in each pixel. Note that the sensor main body 2 may be a complementary metal oxide semiconductor (CMOS) image sensor instead of the CCD image sensor.

The color filter 3 is provided in the sensor main body 2. In the color filter 3, an IR filter is added to a color filter 3x including three filter parts of R, G, and B which parts are arrayed in each pixel in a general Bayer array illustrated in FIG. 5 (a). Note that in the filter in the Bayer array, a basic pattern includes 16 filter parts in the colors in four rows (horizontal sequence)×four columns (vertical sequence). For example, when each filter part is expressed with F, a row number, and a column number, F11, F12, F13, and F14 are in the first row, F21, F22, F23, and F24 are in the second row, F31, F32, F33, and F34 are in the third row, and F41, F42, F43 and F44 are in the fourth row.

In the Bayer array, eight filter parts of F12, F14, F21, F23, F32, F34, F41, and F43 are G, four filter parts of F11, F13, F31, and F33 are R, and four filter parts of F22, F24, F42, and F44 are B. Note that the number of the filter parts in G is twice as large as the number of filter parts in each of R and B since a human eye has high sensitivity with respect to green. Note that recognition with a human eye may not be possible even when one with low sensitivity has high resolution. However, when one with high sensitivity has high resolution, possibility of recognition with a human eye is high and an image with higher resolution is recognized. In this Bayer array, G filters are alternately arranged in a row direction (horizontal direction) and a column direction (vertical direction) and a checkered pattern is formed. In the remaining part, the R filter parts and the B filter parts are arranged in a manner not adjacent to each other.

On the other hand, as illustrated in FIG. 5 (b), by replacement of four of the eight G filter parts in the Bayer array with IR, a color filter 3a including four R parts, four G parts, four B parts, and four IR parts is included as the color filter 3 of the present embodiment. That is, in the basic array with four rows and four columns, four each of the four kinds of R, G, B, and IR filter parts are arranged in such a manner that the same kinds of filter parts are arranged separately so as not to be adjacent to each other in the row direction and the column direction. One each of the R, G, B, and IR filter parts are arranged in each column and two each of two kinds of filter parts among the R, G, B, and IR filter parts are arranged in every other row.

More specifically, four filter parts of F11, F13, F32, and F34 are R, four filter parts of F12, F14, F31, and F33 are IR, four filter parts of F21, F23, F42 and F44 are G, four filter parts of F32, F34, F41, and F42 are B.

In this case, since the number of G filter parts is decreased, there is a possibility that resolution appears to be lower on a human eye. However, colors including IR are uniformly arranged and complementary (interpolation) processing becomes easy. Also, arrangement is made in such a manner that a position of each color is shifted by one column in the first and second rows and the third and fourth rows. In other words, in the first and second rows, and the third and fourth rows, the arrangement of the colors is horizontally reversed.

In such a manner, since each color is arranged by one in each column and each color is arranged by two in every other row in the four-by-four arrangement, resolution in a lateral direction (horizontal direction) becomes higher than that in a longitudinal direction (vertical direction) and it is possible to control a decrease in resolution in the horizontal direction due to provision of an IR filter part. Note that the color filter 3a includes what is acquired by horizontal-reversal of a pattern of the color filter 3a illustrated in FIG. 5 (b), what is acquired by vertical-reversal thereof, and what is acquired by 180°-rotation thereof. Also, what is acquired by 90°-rotation or 270°-rotation of that in a clockwise direction may be included. However, in what is acquired by 90°-rotation or 270°-rotation, resolution in a vertical direction becomes higher than that in a horizontal direction.

Also, as illustrated in a color filter 3b in FIG. 5(c), in the color filter 3, two of four B parts in a pattern of the color filter 3x in the Bayer array may be replaced with IR without reduction of G with high sensitivity of a human.

In this color filter 3b, in the basic array with four rows and four columns, eight G filter parts, four R filter parts, and two B filter parts and IR filter parts among the four kinds filter parts of R, G, B, and IR are arranged, the same kinds of filter parts being arranged separately in such a manner as not to be adjacent to each other in the row direction and the column direction.

More specifically, in the color filter 3b, eight filter parts of F12, F14, F21, F23, F32, F34, F41, and F43 are G, and four filter parts of F11, F13, F31, and F33 are R, two filter parts of F22 and F44 are B, and two filter parts of F24 and F42 are IR. In this case, resolution of G and R is similar to that of the Bayer array although resolution of B is lower than that of the Bayer array. Note that in the color filter 3b, what is acquired by horizontal-reversal of a pattern of the color filter 3b illustrated in FIG. 5(c), what is acquired by vertical-reversal thereof, and what is acquired by 180°-rotation thereof are included. Also, what is acquired by 90°-rotation or 270°-rotation in the clockwise direction has the same pattern with what is acquired by horizontal-reversal or vertical-reversal.

Also, as illustrated in the color filter 3c in FIG. 5(d), in order to improve resolution of IR, two of four B parts in the pattern of the color filter 3x in the Bayer array may be replaced with IR and two of four R parts may be replaced with IR without reduction of G. That is, in the color filter 3c, in the basic array with four rows and four columns, eight G filter parts, four IR filter parts, and two R parts and B filter parts among the four kinds filter parts of R, G, B, and IR are arranged, the same kinds of filter parts being arranged separately in such a manner as not to be adjacent to each other in the row direction and the column direction.

More specifically, as illustrated in FIG. 5 (d), in the color filter 3c, eight filter parts of F12, F14, F21, F23, F32, F34, F41, and F43 are G, two filter parts of F11 and F33 are R, two filter parts of F22 and F44 are B, and four filter parts of F13, F24, F31, and F42 are IR. In this case, resolution of G is kept and resolution of IR can be secured although resolution of R and B becomes lower than that of the Bayer array. Note that in the color filter 3c, what is acquired by horizontal-reversal of a pattern of the color filter 3b illustrated in FIG. 5(d), what is acquired by vertical-reversal thereof, and what is acquired by 180°-rotation thereof are included. Also, what is acquired by 90°-rotation or 270°-rotation in the clockwise direction has the same pattern with what is acquired by horizontal-reversal or vertical-reversal.

As the R filter parts, the G filter parts, and the B filter parts in the color filter 3, known filters can be used. A transmittance spectrum of each of the R filter parts, the G filter parts, and the B filter parts in the present embodiment is in a manner illustrated in the graphs in FIG. 2, FIG. 3, and FIG. 4. In each of FIG. 2, FIG. 3, and FIG. 4, a transmittance spectrum of each of the red (R), green (G), blue (B), and infrared (IR) filters in the color filter 3 is illustrated. A vertical axis indicates transmittance and a horizontal axis is a wavelength. A range of a wavelength in each graph includes the visible-light band and a part of the near-infrared band and indicates, for example, a wavelength range of 300 nm to 1100 nm.

For example, as indicated by R (double line) in the graphs, transmittance of the R filter parts becomes substantially the maximum at a wavelength of 600 nm and a state in which the transmittance is substantially the maximum is kept on a long-wavelength side thereof even when 1000 nm is exceeded.

As indicated by G (wide-space broken line) in the graphs, the G filter parts have a peak at which transmittance becomes the maximum in a part where a wavelength is around 540 nm and have a part in which the transmittance becomes the minimum in a part of around 620 nm on a long-wavelength side thereof. Also, in the G filter parts, there is a rising tendency on a long-wavelength side of the part where the transmittance is the minimum, and the transmittance becomes substantially the maximum at around 850 nm. On a long-wavelength side of that, a state in which the transmittance is substantially the maximum is kept even when 1000 nm is exceeded. As indicated by B (narrow-space broken line) in the graphs, the B filter parts have a peak at which transmittance becomes the maximum in a part where a wavelength is around 460 nm and have a part in which the transmittance becomes the minimum in a part of around 630 nm on a long-wavelength side thereof. Also, there is a rising tendency on a long-wavelength side of that and the transmittance becomes substantially the maximum at around 860 nm. A state in which the transmittance is substantially the maximum is kept on a long-wavelength side of that even when 1000 nm is exceeded. The IR filter parts block light on a short-wavelength side from around 780 nm and light on a long-wavelength side from around 1020 nm. Transmittance is substantially the maximum in a part from around 820 nm to 920 nm.

A transmittance spectrum of each of the R, G, B, and IR filter parts is not limited to what is illustrated in FIG. 2 and the like. However, it is considered that a transmittance spectrum close to this is shown in the color filter 3 that is currently used in general. Note that 1 on a horizontal axis indicating transmittance does not mean that light is transmitted 100% but indicates, for example, the maximum transmittance in the color filter 3.

The cover glass 4 covers and protects the sensor main body 2 and the color filter 3.

Here, DBPF 5 is an optical filter formed on the cover glass 4. DBPF 5 is an optical filter that has a transmission characteristic in the visible-light band, a blocking characteristic in a first wavelength band adjacent to a long-wavelength side of the visible-light band, and a transmission characteristic in a second wavelength band that is a part in the first wavelength band.

That is, as indicated by DBPF (solid line) in the graph in FIG. 2, DBPF 5 has high transmittance in two bands that are a visible-light band indicated by DBPF (VR) and an infrared band (second wavelength band) that is at a slightly apart position on a long-wavelength side of the visible-light band and is indicated by DBPF (IR). Also, DBPF (VR) as a band with high transmittance in the visible-light band is, for example, a wavelength band of around 370 nm to 700 nm. Also, DBPF (IR) as the second wavelength band with high transmittance on an infrared side is, for example, a band of around 830 nm to 970 nm.

In the present embodiment, a relationship between a transmittance spectrum of each filter part in the color filter 3 and a transmittance spectrum of DBPF 5 is prescribed as follows.

That is, DBPF (IR) that is the second wavelength band to transmit infrared light in the transmittance spectrum of DBPF 5 is included in a wavelength band A which is illustrated in FIG. 2 and in which transmittance of all of the R filter parts, G filter parts, and B filter parts is substantially the maximum and the transmittance of the filter parts becomes substantially the same and in a wavelength band B to transmit light at substantially the maximum transmittance in the IR filter parts.

Here, the wavelength band A in which the transmittance of the R, G, and B filter parts becomes substantially the same is a part where a difference in the transmittance of the filter parts is 10% or smaller in the transmittance.

Note that on a short-wavelength side of the wavelength band A, the transmittance of the G and B filter parts becomes low while the transmittance of the R filter parts becomes substantially the maximum. In DBPF 5, this part with a difference in the transmittance of the R, G, and B filter parts corresponds to a part, in which light is almost blocked and transmittance becomes the minimum in DBPF 5, between DBPF (VR) that is a part with high transmittance in the visible-light band and DBPF (IR) that is a part with high transmittance in the second wavelength band of the infrared light band. That is, on the infrared side, transmission of light in a part where a difference in the transmittance of the R, G, and B filter parts becomes large is cut and light is transmitted in the wavelength band A which is on a long-wavelength side thereof and in which the transmittance of the filter parts becomes substantially the maximum and the transmittance becomes substantially the same.

From the above, in the present embodiment, since a region to transmit light is not only in the visible-light band but also in the second wavelength band on the infrared light side in DBPF 5 used instead of the infrared light cut filter, there is an influence of light passing through the second wavelength band in color photographing with visible light. However, as described above, the second wavelength band does not transmit light in a part where transmittance of the R, G, and B filter parts is different and only transmits light in a wavelength band in which transmittance of the filter parts becomes substantially the maximum and substantially the same.

Also, in a second wavelength low region in DBPF 5, light in a part where transmittance of the IR filter parts becomes substantially the maximum is transmitted. Thus, in a case where it is assumed that R, G, B, and IR filter parts are respectively provided in extremely close four pixels to which substantially the same light is emitted, in the second wavelength band, light passes through the R filter part, the G filter part, the B filter part, and the IR filter part in substantially a similar manner. As light on an infrared side, light of substantially the same quantity reaches photodiodes of the pixels of the imaging sensor main body in the filter parts including IR. That is, quantity of light, which passes through the second wavelength band on the infrared side, in light transmitted through each of the R, G, and B filters becomes similar to quantity of light passing through the IR filter part. In a case where assumption is made in the above-described manner, basically, a difference between an output signal of a pixel assumed in the above-described manner which signal is from the sensor main body 2 that receives light transmitted through each of the R, G, and B filters and an output signal of a pixel assumed in the above-described manner which signal is from the sensor main body 2 that receives light passing through the IR filter becomes an output signal in a visible light part of each of R, G, and B from which part infrared-side light passing through each of the R, G, and B filter parts is cut.

Actually, as illustrated in each pattern of the color filter 3 (3a, 3b, and 3c), any one of R, G, B, and IR filter parts is arranged in each pixel of the sensor main body 2. Since it is likely that quantity of light in each color which light is emitted to each pixel varies, for example, it is possible to calculate luminance of each color in each pixel by using a known interpolation method and to set a difference between this interpolated luminance of R, G, and B in each pixel and luminance of IR, which luminance is also interpolated, as luminance of each of R, G, and B in each pixel. Note that an image processing method of removing an infrared light component from luminance of each of the colors of R, G, and B is not limited to this. Any kind of method can be used as long as the method can finally cut an influence of light, which passes through the second wavelength band, from luminance of each of R, G, and B. In any method, since DBPF 5 cuts a part where transmittance of the R, G, and B filter parts is different for more than 10% on an infrared side, that is, a part where transmittance is different for more than a predetermined rate, processing of removing an influence of infrared light becomes easy in each pixel.

Also, this imaging sensor 1 is used as an imaging sensor in an imaging device that can perform both of color photographing and infrared light photographing. Generally, it is considered that normal photographing is performed in the color photographing and the infrared photographing is performed at night by utilization of illumination of infrared light, which cannot be recognized by a human, without utilization of illumination of visible light. For example, it is considered that night photographing with infrared light by utilization of infrared-light illumination is performed in various monitoring cameras and the like in night photographing at a place where night illumination is not necessary or a place that is not preferably illuminated at night. Also, utilization in daytime photographing and night photographing for observation of a wild animal, or the like is also possible.

In a case where infrared light photographing is used as night photographing, infrared-light illumination is necessary since quantity of infrared light is in short at night similarly to visible light. A transmittance spectrum of DBPF 5 illustrated in FIG. 3 is determined in consideration of a transmittance spectrum of each of the R, G, B, and IR filter parts and an emission spectrum of light for infrared-light illumination such as infrared-light LED for illumination. In FIG. 3, an emission spectrum IR-light of LED illumination is illustrated in addition to transmittance spectrums R, G, B, and IR of the filter parts in the colors and a transmittance spectrum DBPF of DBPF 5 which spectrums are similar to those in FIG. 2.

Similarly to DBPF illustrated in FIG. 2, a second wavelength band that is indicated by DBPF (IR) and that is a part to transmit infrared light in DBPF illustrated in FIG. 3 is included in a wavelength band A which is illustrated in FIG. 2 and in which transmittance of all of the R filter part, G filter part, and B filter part becomes substantially the maximum and transmittance of the filter parts becomes substantially the same and in a wavelength band B that transmits light at the maximum transmittance of the IR filter part.

In addition, substantially a whole wavelength band which is included in both of the above-described wavelength band A and wavelength band B and in which an emission spectrum of infrared-light illumination reaches a peak is included in a wavelength band of DBPF (IR). Note that in a case where infrared light photographing is performed not with natural light at night but with infrared-light illumination, it is not necessary that the second wavelength band indicated by DBPF (IR) is wider than a peak width of an optical spectrum of the infrared-light illumination. In a case where a spectrum of the infrared-light illumination is included in both of the above-described wavelength band A and wavelength band B, a peak part of transmittance of DBPF 5 indicated by DBPF (IR) may be provided as the second wavelength band in a peak width substantially similar to a peak width of a peak of the emission spectrum of the infrared-light illumination with around 860 being the peak, for example.

That is, in FIG. 3, the peak in the emission spectrum of the infrared-light illumination which spectrum is indicated by IR-light is on a short-wavelength side of the above-described wavelength band A and wavelength band B. Also, the second wavelength band of DBPF which part is indicated by DBPF (IR) substantially overlaps with the peak of the emission spectrum in IR-light in a part on the short-wavelength side of the wavelength band A and the wavelength band B.

Also, similarly to a graph illustrated in FIG. 3, in the graph illustrated in FIG. 4, an emission spectrum of infrared-light illumination is added to the graph illustrated in FIG. 2 and a second wavelength band which is indicated by DBPF (IR) and which is a part where transmittance on an infrared side of a transmittance spectrum of DBPF 5 is high is adjusted to a peak of the above-described emission spectrum, which is indicated by IR-light, of the infrared-light illumination.

In FIG. 4, as infrared-light illumination, one with a wavelength of a peak of an emission spectrum being longer than that in the case illustrated in FIG. 3 is used. This peak is included in the above-described wavelength band A and wavelength band B and is on a long-wavelength side of the wavelength band A and the wavelength band B. In accordance with this, a second wavelength band indicated by DBPF (IR) in DBPF 5 is provided in such a manner as to substantially overlap with a peak, which is indicated by IR-light, of the infrared illumination in the above-described wavelength band A and wavelength band B.

Note that the second wavelength band of DBPF 5 may be what is illustrated in any of FIG. 2, FIG. 3, and FIG. 4. The second wavelength band only needs to be included in both of the above-described wavelength band A and wavelength band B. Also, in a case where a wavelength band in which an emission spectrum of infrared-light illumination used in night infrared light photographing at night reaches a peak is determined, it is preferable that the wavelength band is included in both of the above-described wavelength band A and wavelength band B and the second wavelength band of DBPF 5 is adjusted to the peak of the emission spectrum of the infrared-light illumination.

In such an imaging sensor, the second wavelength band that transmits light on an infrared side of DBPF 5 is included, on an infrared side of each of R, G, B, and IR filter parts, in the wavelength band A in which transmittance of each filter part becomes substantially the maximum and transmittance of the filter parts becomes substantially the same and the wavelength band B in which transmittance of an IR filter part becomes substantially the maximum. In other words, on along-wavelength side of a visible-light band, transmittance of only an R fill part among R, G, and B filters becomes substantially the maximum and transmittance of the G and B filter parts are not substantially the maximum. Thus, light in a part where the transmittance of the R, G, and B filter parts is not substantially the same and is different is cut by DBPF 5.

That is, in each of the R, G, B, and IR filter parts, light in the second wavelength band is transmitted on the infrared side. Thus, transmittance on the infrared side in the filter parts is substantially the same. When the same quantity of light to be in the second wavelength band is emitted, transmission light quantity in the R, G, B, and IR filter parts becomes the same. Accordingly, as described above, it is possible to correct a color based on an output signal from a pixel corresponding to each of the R, G, and B filter parts and to easily acquire an image in which an influence due to infrared light passing through a second wavelength band of a color in color photographing is controlled.

Also, since the second wavelength band is made to correspond to a peak of the emission spectrum of the infrared-light illumination which spectrum is included in the above-described wavelength band A and wavelength band B, light of the infrared-light illumination can be efficiently used. Also, it is possible to narrow down a width of the second wavelength band and to reduce an influence of infrared light passing through the second wavelength band in color photographing.

FIG. 6 is a view illustrating an imaging device 10 using the imaging sensor 1 of the present embodiment. The imaging device 10 includes a lens for imaging 11, an imaging sensor 1 with DBPF 5, and a signal processing unit (signal processing device) 12 that processes an output signal 13 output from the imaging sensor 1 and that performs the internal processing, the image processing of removing an influence of infrared light passing through the second wavelength band in color photographing, or image processing such as gamma correction, white balancing, or RGB matrix correction with respect to an image signal. From an image processing unit, an output signal 14 of a visible color image and an output signal 15 of an infrared light image can be output.

The lens 11 is included in an optical system that forms an image on the imaging sensor 1 of the imaging device 10. For example, the lens 11 includes a plurality of lenses.

FIG. 7 is a block diagram illustrating signal processing in the signal processing unit 12 of the imaging device 10. Output signals of pixels of R, G, B, and IR are respectively transmitted internal processing blocks 21r, 21g, 21b, and 21*ir*. For example, as illustrated in FIG. 8, in a case of the above-described color filter 3*b*, in the internal processing blocks 21*r*, 21*g*, 21*b*, and 21*ir*, signals of R, G, B, and IR are respectively converted by interpolation processing into image data 20*r* in which all pixels are expressed in red R, image data 20*g* in which all pixels are expressed in green G, image data 20*b* in which all of the pixels are expressed in blue B, and image data 20*ir* in which all pixels are expressed in infrared IR in image data in each frame. Note that as an interpolation processing method, a known method can be used.

Then, in infrared light removal signal creating blocks 22*r*, 22*g*, 22*b*, and 22*ir*, a signal that is subtracted from each R, G, and B signals is generated from an IR signal in order to remove an influence of infrared light received from of the above-described second wavelength band. These signals respectively created for R, G, and B by the infrared light removal signal creating blocks 22*r*, 22*g*, and 22*b* are respectively subtracted from the R, G, and B signals. In this case, as described above, an IR signal is basically removed from each of R, G, and B signals in the same pixel. Thus, the processing becomes easy. Actually, since sensitivity is different in each pixel of each color due to a characteristic or the like of a filter part in each pixel, signals to be subtracted from the R, G, and B signals are created for R, G, and B images from an IR signal.

Then, with respect to each of the R, G and B signals, known RGB matrix processing of converting each of the R, G and B signals and correcting a color by using a determinant, known white-balance processing of making output values of the R, G, and B signals the same in a part to be white in an image, and known gamma correction that is correction for an image output to a display or the like are performed in an image processing block 23. Subsequently, in a luminance matrix block 24, a signal with luminance Y is generated by multiplication of the R, G, and B signals by a coefficient. Also, color difference signals R-Y and B-Y are calculated by division of the signal of blue B and the signal of red R by the signal with the luminance Y and the signals of Y, R-Y, and B-Y are output.

Also, an IR signal is basically output as a gradation image in black and white.

As described with reference to the imaging sensor 1, in such an imaging device 10, image processing of removing an influence of infrared light from a color image can be easily performed and a visible color image with high color reproducibility can be acquired. Also, it is possible to reduce a development cost of such an imaging device.

As described above, in a case where an influence of infrared light passing through the second wavelength band is cut by image processing in visible light photographing, a part in which transmittance of the R, G, and B filter parts is greatly different from each other is physically cut by DBPF. In the image processing, processing of cutting IR light in a part where transmittance becomes substantially the maximum on an infrared side of each of the R, G, and B filter parts is performed. In this case, the image processing becomes easy and it becomes possible to acquire color image data having color reproducibility similar to that in a case where a conventional infrared light cut filter is used.

For example, light that passes through each of the R, G, and B filter parts and reaches a photodiode is visible light transmitted through each filter part in a visible light region and infrared light that passes through the second wavelength band, that becomes similar in the R, G, and B filter parts, and that becomes similar in the IR filter part. Thus, for example, by subtracting an IR output signal of after the interpolation processing, which signal is corrected in accordance with a characteristic such as sensitivity based on a filter part in each color, from each of R, G, and B output signals of after the interpolation processing in the imaging sensor 1, it is possible to acquire color reproducibility close to that in a case where the infrared cut filter is used.

Note that when a wavelength band in which there is a difference larger than 10% in transmittance of the R, G and B filter parts is included in the second wavelength band that transmits light, it becomes practically difficult to calculate quantity of infrared light to be cut from the light that passes through each filter part and it is difficult to acquire image data, which has color reproducibility similar to that in a case where the infrared light cut filter is used, by image processing.

Next, an imaging device according to a second embodiment of the present invention will be described.

As illustrated in FIG. 9, in an imaging device 10*a* of the second embodiment, DBPF 5 is not provided on an imaging sensor 1 but DPBF is provided on a lens 11.

The imaging device 10*a* includes a lens for imaging 11 with DBPF 5, an imaging sensor 1, and a signal processing unit 12 that processes an output signal 13 output from the imaging sensor 1 and that performs the internal processing, the image processing of removing an influence of infrared light passing through a second wavelength band in color photographing, or image processing such as gamma correction, white balancing, or RGB matrix correction with respect to an image signal. From an image processing unit, an output signal 14 of a visible color image and an output signal 15 of an infrared light image can be output.

DBPF 5 and a color filter 3 are similar to DBPF 5 and the color filter 3 of the first embodiment. A relationship between transmittance of each of R, G, B, and IR filter parts of the color filter 3 and a second wavelength band DBPF (IR) of DPBF 5 is also similar to that in the first embodiment. Thus, it is possible to acquire an effect similar to that of the imaging device 10 of the first embodiment even when DBPF 5 is provided in the lens 11 unlike the first embodiment. Note that DBPF 5 may be provided anywhere as long as provision is in an optical system of the imaging device 10*a*, light in a visible-light band (DBPF (VR)) and in a second wavelength band on an infrared side (DBPF (IR)) is transmitted, and light on a short-wavelength side of the visible-light band, on a long-wavelength side of the second wavelength band, and in a wavelength band between the visible-light band and the second wavelength band is blocked with respect to light that reaches the imaging sensor 1.

Next, an imaging sensor and an imaging device of a third embodiment of the present invention will be described. In an imaging sensor 1 and an imaging device of the third embodiment, a part of a configuration of a color filter 3 and a method of removing an IR component from each of RGB signals are different but the other configuration is similar to that of the first embodiment. The color filter 3 and the method of removing an IR component will be described in the following.

For example, as illustrated in FIG. 10, in a color filter 3*e* (first configuration of RGBC) in the present embodiment, two of four B parts are C, two of four R parts are C, and four of eight G parts are C in a pattern of a color filter 3*x* in the above-described Bayer array. That is, in the color filter 3*e*, in a basic array of four rows and four columns, four G filter parts, eight C filter parts, and two R filter parts and B filter parts among filter parts of four kinds of R, G, B, and C are arranged, the same kinds of filter parts being arranged separately in such a manner as not to be adjacent to each other in a row direction and a column direction. Thus, the eight C filter parts are arranged in a checkered pattern. Here, C indicates a transparent state as a clear filter part and basically has a transmission characteristic from a visible-light band to a near-infrared wavelength band. Here, C=R+G+B in the visible-light band. Note that since three colors of RGB are transmitted, C indicating clear can be called white light, that is, white (W) and C=W=R+G+B is acquired. Thus, C corresponds to light quantity in substantially a whole wavelength band of the visible-light band.

Here, as illustrated in a graph illustrating a transmittance spectrum (spectral transmission characteristic) of the color filter 3e and DBPF 5 in FIG. 11, there is a transmission characteristic on a long-wavelength side of a visible-light band in each of the R, G, and B filter parts and light is also transmitted on the long-wavelength side of the visible-light band in the C filter part that is a clear filter part. Similarly to the first embodiment, by utilization of DBPF 5 with respect to this, infrared that passes through the long-wavelength side of the visible-light band is limited to be a second wavelength band. Thus, quantity of light passing through the R, G, B, and C filter parts and DBPF 5 becomes substantially the same (approximate) in each of the R, G, B, and C filter parts and transmission characteristics corresponding to wavelengths of the R, G, B, and C filter parts are different in the visible-light band.

Note that in each of the first and second embodiments, infrared that passes through the long-wavelength side of the visible-light band is also limited to be a second wavelength band. Thus, quantity of light passing through the R, G, B, and IR filter parts and DBPF 5 becomes substantially the same in each of the R, G, B, and IR filter parts and transmission characteristics corresponding to wavelengths of the R, G, B, and IR filter parts are different in the visible-light band.

Accordingly, in the third embodiment, it is also possible to perform IR correction of each pixel accurately and to generate a visible image with high color reproducibility. That is, even when the above-described IR filter part, which has a blocking characteristic in substantially a whole wavelength region of a visible-light band and has a transmission characteristic in infrared on a long-wavelength side of the visible-light band, is not included unlike the first embodiment, an IR signal can be calculated by the following expression since the C filter part is included.

In the following description, C (W), R, G, B, and IR indicate levels of an output signal from the imaging sensor 1. Here, it is assumed that C (W), R, G, and B indicate levels in the visible-light band and do not include an infrared component.

Here, when the color filter 3e is designed in a manner of C=W≈R+G+B and an IR signal to be removed from each of RGB signals is IR', $$IR'=((R+IR)+(G+IR)+(B+IR)-(C+IR))/2=IR+(R+G+B-C)/2$$

IR' IR is acquired. Note that IR indicates an actual value acquired by measurement or the like and IR' indicates a value acquired by calculation. It is possible to perform IR correction by subtracting IR' from each filter.

That is,

R filter (R+IR):

$$R'=(R+IR)-IR'=R-(R+G+B-C)/2$$

G filter (G+IR):

$$G'=(G+IR)-IR'=G-(R+G+B-C)/2$$

B filter (B+IR):

$$B'=(B+IR)-IR'=B-(R+G+B-C)/2$$

C(=W) filter (W+IR):

$$W'=(C+IR)-IR'=C-(R+G+B-C)/2.$$

Accordingly, even when a clear C filter part is used instead of an IR filter part in the color filter 3, it is possible to approximate transmittance of IR in each filter part by DBPF 5 and to improve color reproducibility by calculating an IR component and removing this from a signal of each filter part as described above.

Note that in such a calculation, for example, R+IR, G+IR, B+IR, and C+IR are calculated in each pixel by an interpolation method as described above and the above calculation is performed in each pixel. Note that designing is performed in the manner of C=W≈R+G+B. However, accurate matching with this expression is not necessary. There may be a deviation due to an error or the like and there may be, for example, a deviation of around 10% as long as there is approximation.

Also, since C becomes R+G+B and is easily saturated due to large quantity of light received in a pixel, quantity of received light in the visible-light band may be decreased, quantity of received light may be decreased in a wavelength band including an infrared wavelength band and the visible-light band in the C filter part or an amount of electric charge accumulated with respect to the quantity of received light may be decreased in an element part included in each pixel. In that case, it is necessary to change the above-described expression accordingly.

Note that FIG. 12 is a view illustrating a different array of R, G, B, and C color filters, one each of R, G, B, and C parts being uniformly arranged in a two-by-two array.

Also, in a case of a conventional Bayer array of R, G, and B, one each of R and B parts, and two G parts are arranged in a two-by-two array as illustrated in FIG. 13.

Also, a two-by-two array of R, G, B, and IR color filters, in which array one G part in the conventional array that does not include C or IR is replaced with IR, becomes an array in which one each of R, G, B, and IR parts are arranged as illustrated in FIG. 14.

As such a color filter, there is a difference in characteristics as illustrated in FIG. 15 in the first configuration of RGB-C illustrated in FIG. 10, a second configuration of RGB-C illustrated in FIG. 12, a conventional RGB array illustrated in FIG. 13 (Bayer array), and an example of an RGB-IR array illustrated in FIG. 14. Note that C does not include color information such as RGB but includes information of luminance as light quantity.

Thus, due to a checkered arrangement of C, luminance resolution is high but there are sparse RGB pixels in an RGB-C (first configuration) sensor.

In addition, since an arrangement becomes asymmetrical, resolution is low and moire is likely to be generated. However, since resolution required to a color signal is ½ or lower of that of a luminance signal and is low, there is no problem. Also, sensitivity is high.

RGB-C (second configuration) has luminance resolution and color resolution equivalent to those of a conventional RGB sensor and sensitivity higher than that of the RGB sensor. An RGB-IR sensor has lower sensitivity and lower luminance resolution than the RGB sensor since IR that does not have a transmission characteristic in the visible-light band is provided.

That is, it is likely that a color filter having C has an advantage in resolution or sensitivity compared to a color filter having IR in each of the above-described first embodiment and second embodiment.

FIG. 16 is a block diagram illustrating signal processing in the signal processing unit 12 in FIG. 9. As the imaging sensor 1, an RGB-C sensor 1 including the above-described RGB-C color filter 3e is included. Also, a lens 11 included in an optical system and DBPF 5 are included.

Signals of R+IR, G+IR, B+IR, and C+IR are input from the RGB-C sensor 1 into a separation device 51 to perform color separation, IR separation, and IR correction. By interpolation processing, the IR correction, and the like, each of R, G, B, W, and IR signals is calculated and output in each pixel. This processing is performed on the basis of calculation using the above expression.

Each of the R, G, and B signals among the R, G, B, W, and IR signals output from the separation device 51 is transmitted to a color matrix device 52. Then, known RGB matrix correction or the like is performed and RGB signals are output. Also, the R, G, B, W, and IR signals from the separation device 51 are transmitted to a luminance generation device 53. A luminance signal is generated from each signal on the basis of an expression of calculating set luminance.

The RGB signals output from the color matrix device are input into a gamma processing and color difference generation device 54 and known gamma processing is performed. Also, for example, B-Y and R-Y signals are generated as color difference signals. Also, after noise reduction as a signal in a predetermined wavelength band in a noise reduction device 56 through a band pass filter (BPF) 55, a signal output from each of the separation device 51 and the RGB-C sensor 1 is amplified in an enhancement processing device 57 along with a luminance signal output from the luminance generation device 53 and is output as a luminance signal (Y signal) of a luminance/color difference signal after gamma processing in the gamma processing device 58.

Also, an IR signal output from the separation device 51 is output as an IR signal through an enhancement processing device 59 and a gamma processing device 60. Note that in the processing of an image signal, clip processing (described later) is performed and the clip processing will be described later.

Next, an imaging sensor and an imaging device of a fourth embodiment of the present invention will be described. In the fourth embodiment, each color of a color filter is generalized and it is indicated that a color filter of the present invention is not limited to RGB-IR or RGB-C. In the following, a method of removing an IR component in an imaging sensor including a color filter with generalized four color filter parts will be described. Note that the four colors (four kinds) of filter parts basically have different transmission characteristics corresponding to wavelengths in a visible-light band. In addition, a third wavelength band, in which a difference in transmittance with a difference filter part on a long-wavelength side of the visible-light band becomes 10% or smaller, is included in a wavelength band including the above-described second wavelength band of DBPF and the second wavelength band of DBPF 5 is included in this third wavelength band. Accordingly, in a case where a color filter and DPBF 5 are used, transmission characteristics corresponding to wavelengths on an infrared side of the visible-light band are approximate to each other in the filter parts in the colors.

Moreover, in a filter arrangement of four kinds of pixels, IR can be separated when a color filter is designed in the following condition.

In the filter arrangement, it is preferable that one each of four kinds of filter parts A, B, C, and ID are included in a two-by-two arrangement as illustrated in FIG. 17.

Also, it is preferable that the filter parts A, B, C, and D are designed in such a manner that the following relationship is established in a visible wavelength band when possible.

That is, in the visible-light band, it is assumed that $KaA+KbB+KcC+KdD \approx 0$.

Note that each of A, B, C, and D indicates a level of an output signal from the imaging sensor 1 in a visible-light band of each filter part.

It is assumed that transmittance of IR becomes substantially constant in the above-described third wavelength band of each of the A, B, C, and ID filter parts in an IR region on a long-wavelength side of the visible-light band. Note that transmittance of IR may be substantially an integer multiple of certain IR transmittance in each of the A, B, C, and D filter parts. When designing is performed in such a manner (here, it is assumed that IR transmittance is constant as described above), $$Ka(A+IR)+Kb(B+IR)+Kc(C+IR)+Kd(D+IR) \approx IR(Ka+Kb+Kc+Kd).$$

Thus, an IR signal can be calculated by $$IR'=(Ka(A+IR)+Kb(B+IR)+Kc(C+IR)+Kd(D+IR))/(Ka+Kb+Kc+Kd).$$

By the following calculation, it is possible to correct an IR component included in each of A, B, C, and D pixels.

$$A'=(A+IR)-(Ka(A+IR)+Kb(B+IR)+Kc(C+IR)+Kd(D+IR))/(Ka+Kb+Kc+Kd)=A-(KaA+KbB+KcC+KdD)/(Ka+Kb+Kc+Kd)$$

$$B'=B+IR-(Ka(A+IR)+Kb(B+IR)+Kc(C+IR)+Kd(D+IR))/(Ka+Kb+Kc+Kd)=B-(KaA+KbB+KcC+KdD)/(Ka+Kb+Kc+Kd)$$

$$C'=C+IR-(Ka(A+IR)+Kb(B+IR)+Kc(C+IR)+Kd(D+IR))/(Ka+Kb+Kc+Kd)=C-(KaA+KbB+KcC+KdD)/(Ka+Kb+Kc+Kd)$$

$$D'=D+IR-(Ka(A+IR)+Kb(B+IR)+Kc(C+IR)+Kd(D+IR))/(Ka+Kb+Kc+Kd)=D-(KaA+KbB+KcC+KdD)/(Ka+Kb+Kc+Kd)$$

Here, an error amount is $(KaA+KbB+KcC+KdD)/(Ka+Kb+Kc+Kd)$. This error amount can be corrected in an RGB matrix.

Actually, since transmittance of an IR component in the filter parts varies slightly, correction is performed with a coefficient-corrected signal as described in the following.

$$A'=A+IR*KIRa-KIRa(Ka(A+IR*KIRa)+Kb(B+IR*KIRb)+Kc(C+IR*KIRc)+Kd(D+IR*KIRd))/(Ka*KIRa+Kb*KIRb+Kc*KIRc+Kd*KIRd)$$

$$B'=B+IR*KIRb-KIRb(Ka(A+IR*KIRa)+Kb(B+IR*KIRb)+Kc(C+IR*KIRc)+Kd(D+IR*KIRd))/(Ka*KIRa+Kb*KIRb+Kc*KIRc+Kd*KIRd)$$

$$C'=C+IR*KIRc-KIRc(Ka(A+IR*KIRa)+Kb(B+IR*KIRb)+Kc(C+IR*KIRc)+Kd(D+IR*KIRd))/(Ka*KIRa+Kb*KIRb+Kc*KIRc+Kd*KIRd)$$

$$D'=D+IR*KIRd-KIRd(Ka(A+IR*KIRa)+Kb(B+IR*KIRb)+Kc(C+IR*KIRc)+Kd(D+IR*KIRd))/(Ka*KIRa+Kb*KIRb+Kc*KIRc+Kd*KIRd)$$

Note that a spectral transmission characteristic of each filter of when DBPF is used is in a manner illustrated in FIG. 11. Note that an example of filter parts is an example of using four kinds of filter parts of R+IR, G+IR, B+IR, and C+IR. However, the filter parts are not limited to R+IR, G+IR, B+IR, and C+IR as long as a color filter is designed in such a manner that IR parts are constant or in a relationship of an integer multiple to each other and KaA+KbB+KcC+KdD≈0 is acquired.

Spectral transmission of a combination of the B filter part and DBPF 5 is illustrated in FIG. 18, spectral transmission of a combination of the G filter part and DBPF 5 is illustrated in FIG. 19, spectral transmission of a combination of the B filter part and DBPF 5 is illustrated in FIG. 20, and spectral transmission of a combination of the C (W) filter part and DBPF 5 is illustrated in FIG. 21.

As expressed in each of the above-described expressions, each spectral transmission characteristic is the sum of four kinds of transmittance of a visible R transmission region, a visible G transmission region, a visible B transmission region, and an IR transparent region. From the above, it is possible to calculate a signal value of each of a visible R transmission region, a visible G transmission region, a visible B transmission region, and an IR transmission region from values of four or more kinds of filters. Note that a spectral transmission characteristic is determined on the basis of an expression expressing each of spectral transmission characteristics of A, B, C, and D. Six kinds are determined from combinations of spectral transmission characteristics of two of these filters.

Next, a fifth embodiment of the present invention will be described.

In a case where an imaging sensor 1 that outputs a signal in a visible-light band and an infrared signal on a long-wavelength side thereof is mounted in a smartphone or the like and in a case where a circuit that processes a signal from the imaging sensor 1 is on a system on chip (SOC) that functions as a main arithmetic processing device on the smartphone side, when RGB signals output from the imaging sensor have an IR component as described above and processing of removing this IR component is necessary, it may be necessary to change a design of SOC. Also, it becomes necessary to provide a circuit for performing the above-described IR correction in the smartphone in addition to SOC. In these cases, in introduction of an imaging sensor, which can output both of visible-light and infrared image signals, into a device such as a smartphone, a cost is increased in a part other than the imaging sensor.

Thus, in the present embodiment, a circuit in which an image signal output in a visible-light band from the imaging sensor 1 is a signal similar to a conventional one is embedded in the imaging sensor. As illustrated in FIG. 22, an imaging sensor 101 includes an imaging unit 102 that has a configuration substantially similar to that of the above-described imaging sensor 1, and an IR correction/separation circuit 103. For example, from the IR correction/separation circuit 103, a visible RGB signal and an IR signal are output. Note that the IR correction/separation circuit 103 includes a circuit that performs processing related to clipping of a signal level (described later).

In this case, the number of pins of the imaging sensor 101 is increased to output an RGB signal and an IR signal. However, it is possible to control the increase in the number of pins by an output in a serial output standard such as CSI-2. Here, a visible RGB signal is output as an RAW signal output of an imaging sensor in a Bayer array of RGBG or as a YUYV (YCb or YCr) signal. Also, when an IR signal is output as a monochromatic signal, it is possible to utilize visible and near-infrared imaging simultaneously by an RGB-IR sensor or an RGB-C sensor without changing SOC of a smartphone or a feature phone.

For example, as illustrated in FIG. 23, a structure of the imaging sensor 101 becomes a multi-layer stack structure. For example, a chip of an integrated circuit included in the IR correction/separation circuit 103 is mounted on one substrate 110 and a chip included in the imaging unit 102 is arranged thereon. A cover glass 111 is arranged on the imaging unit 102. A solder ball 115 is arranged on a bottom surface of the substrate 110.

Also, as illustrated in FIG. 24, in the structure of the imaging sensor 101, two substrates 110 may be arranged in a vertically overlapped manner with a space therebetween, a chip of the IR correction/separation circuit 103 may be arranged on the lower substrate 110, a chip of the imaging unit 102 may be arranged on the upper substrate 110, and the cover glass 111 may be arranged thereon.

Currently, it is possible to realize a small package with a multi-layer stack structure. That is, it is possible to vertically stack the IR correction/separation circuit 103 and the imaging unit 102 as described above and to form a sensor in one package. It is possible to realize the imaging sensor 101, into which an IR correction/separation circuit is embedded, in one package even by this method. In such a manner, it is possible to realize a small sensor that can perform visible/near-infrared light imaging simultaneously and that can be used in a smartphone or the like even when a correction/separation circuit is not embedded. In a smartphone, a function of biometric authentication such as iris authentication, or 3D capture is included by an IR sensor and imaging of a visible video/still image can be realized by one sensor.

That is, in a case where biometric authentication or the like is performed with an infrared sensor, for example, it is considered that the infrared sensor is provided in a manner separated from a camera and that an increase in a cost, deterioration in space efficiency, or the like is caused in this case due to addition of a new infrared sensor. However, it is possible to control these.

FIG. 25 is a schematic view illustrating a signal output, which is similar to that of a Bayer arrangement of RGB, by IR correction+interpolation. In horizontal/vertical scanning, R/IR and G/B are output in a line-sequential manner of R, IR, R, IR . . . /G, B, G, B . . . . With respect to this signal, IR correction/IR separation is performed. Also, at a position of an IR pixel, a G' signal is generated by interpolation from a G signal in the vicinity. Visible R/G' and G/B signals and a separated IR signal are output in a line-sequential manner of R, G', R, G' . . . /G, B, G, B . . . . Since visible R/G' and G/B signals are in an output format that is the same with that of a conventional sensor in the Bayer array of RGB, processing can be performed in a signal processing circuit that is the same with a conventional one on a signal processing side. Also, since an IR signal is still a monochromatic signal, it is also possible for a signal processing unit to perform processing by normal monochrome signal processing.

By the above configuration, it is possible to make a change in a processing circuit as small as possible and to process an output of an RGB-IR sensor in a conventional signal processing circuit. Also, it becomes possible to implement a new function such as biometric authentication or 3D capture by IR imaging without an increase in a space in a smartphone or the like.

Also, an RGB-IR sensor has been described above. However, in simultaneous visible/near-infrared imaging using an RGB-C sensor, it is also possible to acquire a similar effect by embedding a circuit for IR correction/separation into a sensor and by forming a configuration in such a manner that a visible signal, which is in an output format of a conventional sensor in the Bayer array of RGB, and an IR signal are output.

Next, a sixth embodiment of the present invention will be described.

As illustrated in FIG. 26, an imaging device 10 of the present embodiment includes a lens 11 that is an optical system for photographing, an imaging sensor 1 with DBPF 5, and a signal processing unit (signal processing device: subtraction control device) 12 that processes an output signal 13 output from the imaging sensor 1 and that performs the internal processing, the image processing of removing an influence of infrared light passing through a second wavelength band in color photographing, or image processing such as gamma correction, white balancing, or RGB matrix correction with respect to an image signal. An output signal 14 of a visible color image (visible image signal) and an output signal 15 of an infrared light image (infrared image signal) can be output from the signal processing unit 12.

The lens 11 is included in an optical system that forms an image on the imaging sensor 1 of the imaging device 10. For example, the lens 11 includes a plurality of lenses.

For example, as illustrated in FIG. 27, the imaging sensor (image sensor) 1 includes a sensor main body 2 that is a charge coupled device (CCD) image sensor, a color filter 3 in which each of regions of red (R), green (G), blue (B), and infrared (IR) (filter of each color) is arranged in a predetermined array in a manner corresponding to each pixel of the sensor main body 2, a cover glass 4 that covers the sensor main body 2 and the color filter 3, and a double band pass filter (DBPF) 5 formed on the cover glass 4.

The sensor main body 2 is a CCD image sensor. A photodiode as a light-receiving element is arranged in each pixel. Note that the sensor main body 2 may be a complementary metal oxide semiconductor (CMOS) image sensor instead of the CCD image sensor.

The color filter 3 is provided in the sensor main body 2. Here, a color filter in a Bayer array with regions of red R, green G, and blue B and without a region of infrared IR has four-by-four 16 regions serving as a basic pattern. Here, eight regions are G regions, four regions are R, and four regions are B. On the other hand, as illustrated in FIG. 28, in the color filter 3 of the present embodiment, four among the eight G regions in the Bayer array are replaced with IR regions, whereby there are four R regions, four G regions, four B regions, and four IR regions. Note that a color filter including an IR region is not limited to the color filter 3 illustrated in FIG. 28 and a color filter with various arrays can be used. Also, each of RGB regions is in a general RGB filter, has a peak of transmittance in a wavelength range of each color, and has transmittivity in a near-infrared wavelength region. Thus, the red region is R+IR, the green region is G+IR, and the blue region is B+IR in FIG. 28.

A transmittance spectrum of each of the R region, the G region, and the B region in the present embodiment is in a manner illustrated in a graph in FIG. 29. That is, a transmittance spectrum of each of the red (R), green (G), blue (B), and infrared (IR) filters in the color filter 3 is illustrated. A vertical axis indicates transmittance and a horizontal axis indicates a wavelength. A range of a wavelength in the graph includes a visible-light band and a part of a near-infrared band and indicates, for example, a wavelength range of 300 nm to 1100 nm.

For example, as indicated by R (double line) in the graph, transmittance of the R region becomes substantially the maximum at a wavelength of 600 nm and a state in which the transmittance is substantially the maximum is kept on a long-wavelength side thereof even when 1000 nm is exceeded. As indicated by G (wide-space broken line) in the graph, the G region has a peak at which transmittance becomes the maximum in a part, in which a wavelength is around 540 nm, and has a part at which the transmittance becomes the minimum in a part of around 620 nm on a long-wavelength side thereof. Also, in the G region, there is a rising tendency on a long-wavelength side of the part where the transmittance is the minimum, and the transmittance becomes substantially the maximum at around 850 nm. On along-wavelength side of that, a state in which the transmittance is substantially the maximum is kept even when 1000 nm is exceeded. As indicated by B (narrow-space broken line) in the graphs, the B region has a peak at which transmittance becomes the maximum in a part, in which a wavelength is around 460 nm, and has a part in which the transmittance becomes the minimum in a part of around 630 nm on a long-wavelength side thereof. Also, there is a rising tendency on a long-wavelength side of that and the transmittance becomes substantially the maximum at around 860 nm. A state in which the transmittance is substantially the maximum is kept on a long-wavelength side of that even when 1000 nm is exceeded. The IR region blocks light on a short-wavelength side from around 780 nm and light on a long-wavelength side from around 1020 nm. Transmittance is substantially the maximum in a part from 820 nm to 920 nm.

A transmittance spectrum of each of the R, G, B, and IR regions is not limited to what is illustrated in FIG. 29. However, it is considered that a transmittance spectrum close to this is shown in the color filter 3 that is currently used in general. Note that 1 on the vertical axis indicating transmittance does not mean that light is transmitted 100% but indicates, for example, the maximum transmittance in the color filter 3.

The cover glass 4 covers and protects the sensor main body 2 and the color filter 3.

Here, DBPF 5 is an optical filter formed on the cover glass 4. DBPF 5 is an optical filter that has a transmission characteristic in the visible-light band, a blocking characteristic in a first wavelength band adjacent to a long-wavelength side of the visible-light band, and a transmission characteristic in a second wavelength band that is a part in the first wavelength band. Note that an arrangement position of DBPF 5 is not limited to the cover glass 4 and arrangement in a different place in the imaging sensor 1 may be performed. Also, an arrangement position of DBPF 5 is not limited to the imaging sensor 1 and arrangement in an optical system that includes a lens 11 and that forms an image on the imaging sensor 1 may be performed.

As indicated by DBPF (solid line) in the graph in FIG. 29, DBPF 5 has high transmittance in two bands that are a visible-light band indicated by DBPF (VR) and an infrared band (second wavelength band) that is in a slightly apart position on a long-wavelength side of the visible-light band and that is indicated by DBPF (IR). Also, DBPF (VR) as a band with high transmittance in the visible-light band is, for example, a wavelength band of around 370 nm to 700 nm. Also, DBPF (IR) as a second wavelength band with high transmittance on an infrared side is, for example, a band of around 830 nm to 970 nm.

In the present embodiment, a relationship between a transmittance spectrum of each region in the color filter 3 and a transmittance spectrum of DBPF 5 is prescribed as follows.

That is, DBPF (IR) that is the second wavelength band to transmit infrared light in the transmittance spectrum of DBPF 5 is included in a wavelength band A which is illustrated in FIG. 29 and in which transmittance of all of the R region, G region, and B region is substantially the maximum and the transmittance of the regions becomes substantially the same and in a wavelength band B to transmit light at substantially the maximum transmittance in the IR region.

Here, the wavelength band A in which transmittance of the R, G, and B regions becomes substantially the same is a part where a difference in transmittance of the regions is 10% or smaller in the transmittance.

Note that on a short-wavelength side of the wavelength band A (wavelength band C), the transmittance of the G and B regions becomes low while the transmittance of the R region becomes substantially the maximum. In DBPF 5, this part with a difference in the transmittance of the R, G, and B regions corresponds to apart, in which light is almost blocked and transmittance becomes the minimum in DBPF 5, between DBPF (VR) that is a part with high transmittance in the visible-light band and DBPF (IR) that is a part with high transmittance in the second wavelength band of the infrared light band. That is, on the infrared side, transmission of light in a part where the difference in the transmittance of the R, G, and B regions becomes large is cut and light is transmitted in the wavelength band A which is on a long-wavelength side thereof and in which the transmittance of the regions becomes substantially the maximum and the transmittance becomes substantially the same.

From the above, in the present embodiment, since a region to transmit light is not only in the visible-light band but also in the second wavelength band on the infrared light side in DBPF 5 used instead of an infrared light cut filter, there is an influence of light passing through the second wavelength band in color photographing with visible light. However, as described above, the second wavelength band does not transmit light in a part where transmittance of the R, G, and B regions is different and only transmits light in a wavelength band in which transmittance of the regions becomes substantially the maximum and substantially the same.

Also, in a second wavelength low region of DBPF 5, light in a part where transmittance of the IR region becomes substantially the maximum is transmitted. Thus, in a case where it is assumed that R, G, B, and IR regions are respectively provided in extremely close four pixels to which substantially the same light is emitted, in the second wavelength band, light passes through the R region, the G region, the B region, and the IR region in substantially a similar manner. As light on an infrared side, light of substantially the same quantity reaches photodiodes of the pixels of the imaging sensor main body 2 in the regions including IR. That is, quantity of light, which passes through the second wavelength band on the infrared side, in light transmitted through each of the R, G, and B filters becomes similar to quantity of light passing through the IR region. In a case where assumption is made in the above-described manner, basically, a difference between an output signal of a pixel assumed in the above-described manner which signal is from the sensor main body 2 that receives light transmitted through each of the R, G, and B filters and an output signal of a pixel assumed in the above-described manner which signal is from the sensor main body 2 that receives light passing through the IR filter becomes an output signal in a visible light part of each of R, G, and B from which part infrared-side light passing through each of the R, G, and B regions is cut.

Actually, as illustrated in each pattern of the color filter 3 (3a, 3b, and 3c), any one of R, G, B, and IR regions is arranged in each pixel of the sensor main body 2. Since it is likely that quantity of light in each color which light is emitted to each pixel varies, for example, it is possible to calculate luminance of each color in each pixel by using a known interpolation method and to set a difference between this interpolated luminance of R, G, and B in each pixel and luminance of IR, which luminance is also interpolated, as luminance of each of R, G, and B in each pixel. Note that an image processing method of removing an infrared light component from luminance of each of the colors of R, G, and B is not limited to this. Any kind of method can be used as long as the method can finally cut an influence of light, which passes through the second wavelength band, from luminance of each of R, G, and B. In any method, since DBPF 5 cuts a part where transmittance of the R, G, and B regions is different for more than 10% on an infrared side, that is, a part where transmittance is different for more than a predetermined rate, processing of removing an influence of infrared light becomes easy in each pixel.

Also, this imaging sensor 1 is used as an imaging sensor in an imaging device that can perform both of color photographing and infrared light photographing. Generally, it is considered that normal photographing is performed in the color photographing and the infrared photographing is performed at night by utilization of illumination of infrared light, which cannot be recognized by a human, without utilization of illumination of visible light. For example, it is considered that night photographing with infrared light by utilization of infrared-light illumination is performed in various monitoring cameras and the like in night photographing at a place where night illumination is not necessary or a place that is not preferably illuminated at night. Also, utilization in daytime photographing and night photographing for observation of a wild animal, or the like is also possible.

In a case where infrared light photographing is used as night photographing, infrared-light illumination is necessary since quantity of infrared light is in short at night similarly to visible light. A transmittance spectrum of DBPF 5 illustrated in FIG. 29 is determined in consideration of a transmittance spectrum of each of the R, G, B, and IR regions and an emission spectrum of light for infrared-light illumination such as infrared-light LED for illumination.

In such an imaging sensor, the second wavelength band that transmits light on an infrared side of DBPF 5 is included, on an infrared side of each of the R, G, B, and IR regions, in the wavelength band A in which transmittance of each region becomes substantially the maximum and transmittance of the regions becomes substantially the same and the wavelength band B in which transmittance of the IR region becomes substantially the maximum. In other words, on a long-wavelength side of a visible-light band, transmittance of only an R fill part among R, G, and B filters becomes substantially the maximum and transmittance of the G and B regions are not substantially the maximum. Thus, light in a part where the transmittance of the R, G, and B regions is not substantially the same and is different is cut by DBPF 5.

That is, in each of the R, G, B, and IR regions, light in the second wavelength band is transmitted on the infrared side. Thus, transmittance on the infrared side in the regions is substantially the same. When the same quantity of light to be in the second wavelength band is emitted, transmission quantity in the R, G, B, and IR regions becomes the same. Accordingly, as described above, it is possible to correct a color based on an output signal from a pixel corresponding to each of the R, G, and B regions and to easily acquire an image in which an influence due to infrared light passing through a second wavelength band of a color in color photographing is controlled.

Also, since the second wavelength band is made to correspond to a peak of the emission spectrum of the infrared-light illumination which spectrum is included in the above-described wavelength band A and wavelength band B, light of the infrared-light illumination can be efficiently used. Also, it is possible to narrow down a width of the second wavelength band and to reduce an influence of infrared light passing through the second wavelength band in color photographing.

That is, with utilization of DBPF 5, it becomes possible to perform accurate correction by subtracting a value of an IR signal from a value of each of RGB signals of the imaging sensor 1. Here, an imaging processing method in the imaging device will be described before a detail description of the signal processing unit 12.

For example, as expressed in the following, a received light component of a pixel of each color in the imaging sensor 1 is in a state in which an IR component is added to a component of each color.

R pixel R+IR
G pixel G+IR
B pixel B+IR
IR pixel IR

Thus, as expressed in the following, IR correction of removing the IR component from the received light component of each of the RGB pixels excluding the IR pixel is performed.

$R$ signal ($R$ pixel output)−(IR pixel output)=($R$+IR)−IR=$R$ $G$ pixel ($R$ pixel output)−(IR pixel output)=($G$+IR)−IR=$G$ $B$ pixel ($R$ pixel output)−(IR pixel output)=($B$+IR)−IR=$B$ Accordingly, it is possible to remove an IR component, which is transmitted through DBPF 5 and transmitted through the color filter, from the regions of the colors other than IR in the color filter.

However, in the R pixel, the G pixel, and the B pixel, sensitivity with respect to each light source is different and there is a dynamic range in each pixel of the imaging sensor 1. Thus, electric charge that exceeds the dynamic range cannot be read and an output from the imaging sensor is clipped and reaches a peak. That is, when input light exceeds the dynamic range, an output signal is clipped and cut.

As a result, as described in the following, there is an error in a corrected R signal, G signal, and B signal, and a problem such as an unnatural luminance level (decrease in luminance of highlight part), coloring of highlight, or the like is generated.

FIG. 30 to FIG. 32 are graphs for describing a problem in a case where an IR component is subtracted from a component of each color in a state in which a dynamic range is exceeded. FIG. 30 is a graph illustrating a case of R, FIG. 31 is a graph illustrating a case of G, and FIG. 32 is a graph illustrating a case of B. In each of the graphs illustrated in FIG. 30 to FIG. 32, a vertical axis indicates an output level of a signal from a pixel of each color in the imaging sensor 1. A horizontal axis indicates passage of time in an output level of one pixel in the imaging sensor 1 or indicates a position on a column of a pixel (such as position of each pixel on Y axis). Here, for example, the horizontal axis is a position of a pixel on a Y axis. Thus, a change in an output level of a signal in accordance with a position on the Y axis in each pixel of each color is illustrated in each graph. In FIG. 33, an output level of an IR signal with respect to each of the colors illustrated in FIG. 30 to FIG. 32 is illustrated and an output level at a position, of each pixel on the Y axis is indicated similarly to the case of each of the RGB pixels in each of the above-described graphs.

A graph on an upper side in each of FIG. 30 to FIG. 32 indicates an output level of a signal in a state in which a dynamic range is exceed due to a difference in a position on the Y axis. That is, an output level of a signal of each pixel becomes lower after a rise along with a change of a position in a right direction on the Y axis. RGB excluding IR is in a state of exceeding the dynamic range and being clipped. Note that in each pixel of the imaging sensor 1, electric charge can be read only up to a pixel saturation level. Electric charge of equal to or higher than the pixel saturation level cannot be read and an output level becomes a state of being clipped. Also, since an output level of an IR signal is included in an output level of a signal of each of RGB pixels, these respectively become R+IR, G+IR, and B+IR. The output levels of RGB are higher than the output level of the IR signal for single output levels of RGB which levels do not include IR. Thus, a dynamic range is not exceeded in an IR pixel and a state of exceeding a dynamic range is likely to be generated in RGB.

In each of FIG. 30 to FIG. 32, a graph that exceeds a pixel saturation level and that is indicated by a dotted line indicates an output level in a case where clipping is not performed. A graph on a lower side in each of FIG. 30 to FIG. 32 illustrates a case where an output level of IR is subtracted from an output level on an upper side which level includes IR. Here, in an upward convex part, a case where an output level of an IR signal is subtracted from an output level of each of RGB signals of when not being clipped which level is indicated by the dotted line described above is illustrated. However, actually, each of RGB signals of before the subtraction is in a clipped state. Thus, a case where an output level of an IR, which output level becomes a mountain-like shape due to a difference in a position, is subtracted from here becomes a state indicated by a graph on the lower side in a state of being recessed downward from the upward-convex graph on the lower side as indicated by an arrow.

In such a manner, originally, an output level supposed to be in a mountain-like shape in which an output level of a center part in pixels in one column becomes high. However, as described above, since an output level of IR which level does not exceed a dynamic range and is in a mountain-like shape is subtracted from an output level in which an original output level exceeds a dynamic range and is clipped and which becomes flat at a pixel saturation level, a part in which an output level is originally the highest is in a state of being recessed in contrast.

In a case where the pixel saturation level is exceeded, an output level of an image signal of a pixel in each color reaches a peak. At the time, IR is still lower than the pixel saturation level and an output level of IR becomes higher as luminance becomes higher even after the other colors exceed the pixel saturation level. That is, even when luminance becomes higher, an output level of a signal of each of RGB pixels is clipped and does not become higher but an output signal of IR to be subtracted from these becomes higher. Thus, an output level acquired by subtraction of an output level of IR from an output level of each of RGB becomes lower as luminance becomes higher. Accordingly, an output level becomes low in contrast in a part where an output level is supposed to be the highest and luminance becomes low in a highlight part. Also, a part where an output level of each of RGB exceeds the pixel saturation level is supposed to be white. However, there is a difference in an output level in a case where each of RGB becomes a downward convex, whereby the highlight part does not become white and is in a state of being colored.

Thus, when an output level of an IR signal is subtracted from an output level of a signal of each of RGB pixels, in a case where the output level of the signal of each of the RGB pixels is clipped at the pixel saturation level due to the dynamic range being exceeded, subtraction is performed after the output level of IR to be subtracted therefrom is lowered. That is, as illustrated in FIG. 33 and FIG. 34, in a value of the output level of the IR signal which level is subtracted from each of the output levels of RGB, a limit value is set with respect to the output level of the IR signal, which level is subtracted from the output level of the signal of each of the RGB pixels, according to each of RGB signals (component) in such a manner that the output level is clipped even in a case of not exceeding the dynamic range and being lower than the pixel saturation level. An output level that becomes equal to or higher than the limit level is brought into a state of being clipped at the set limit value (being limited to reach peak).

In a case where an IR signal that is clipped at a limit value set for each of RGB in such a manner is subtracted from each of the RGB signals, since the IR signal to be subtracted therefrom is clipped at the limit value unlike the case illustrated in each of FIG. 30 to FIG. 32, an output level of each of the RGB signals does not become low when luminance becomes high, and is clipped at a signal saturation level of after the subtraction as illustrated in FIG. 35($a$), FIG. 35 ($b$), and FIG. 35($c$). This signal saturation level is a value acquired by subtraction of a limit value of the IR signal, which value corresponds to each of RGB, from the pixel saturation level of each of the RGB signals. Thus, a phenomenon such as a decrease in luminance in the highlight part is not generated. Note that a signal saturation level of each of the RGB signals which level is generated after the subtraction of the IR signal becomes a level lower than the pixel saturation level since the limit value of the IR signal is subtracted from the pixel saturation level in a case where each of the RGB signals exceeds the dynamic range. Also, as described later, the signal saturation level of each of the RGB signals after the subtraction of the IR signal varies depending on a color.

Note that a position where an output level of the IR signal is clipped (limit value of IR signal) illustrated in FIG. 34 varies depending on each of the RGB signals, on which subtraction is performed, and a situation.

That is, with respect to a limit value (clip level) of the output level of the IR signal of when correction of each of the RGB signals is performed, an appropriate clip level varies according to each of the colors of RGB and depending on spectral sensitivity of the imaging sensor 1, a color temperature of a light source, or a kind of a light source. Although it is difficult to uniformly calculate this level by calculation, it is possible to determine the level by measuring an output level of each of RGB signals and an output level of an IR signal that are output from a sensor with respect to each light source (color temperature). Note that spectral sensitivity of the imaging sensor 1 is determined depending on the imaging sensor 1. Also, a color temperature is determined to some extent depending on a kind of a light source. Thus, it is necessary to calculate the above-described limit value in a value of an IR signal, which limit value corresponds to each of RGB signals and at which limit value an output level of IR is clipped, on the basis of a color temperature.

In a camera, a level of each of the RGB signals varies according to a change in a color temperature of a light source. For example, an R signal is increased and a B signal is decreased with respect to a light source with a low color temperature.

Also, a B signal is increased and an R signal is decreased with respect to a light source with a high color temperature. As a result, an image becomes reddish in a case where a color temperature is low and an image becomes bluish in the case where a color temperature is high. Thus, color reproducibility varies depending on a change in a color temperature of a light source. In order to stabilize this color reproducibility, white-balance processing (WB) to make levels of the RGB signals constant is performed.

The white-balance processing is performed by measurement of a color temperature of a light source from a color signal and by adjustment of a gain of each of color signals of RGB. Today, a system of performing white balance detection from an image signal and performing control according to a result of the detection is generally used. For example, a feedback control loop is configured by an RGB gain adjustment circuit (included in control circuit 21 in FIG. 38) and a white-balance detection circuit 26 (illustrated in FIG. 38). In the white-balance detection circuit 26, integration of an R-Y signal, a B-Y signal, or R, G, and B signals is performed. In a case of performing integration of the R-Y signal and the B-Y signal, control is performed in such a manner that an integration value thereof becomes zero. Also, in a case of performing integration of the R, G, and B signals, a gain of each of the RGB signals is controlled in such a manner that integration values becomes identical to each other.

Here, it is possible to calculate a ratio of the R signal, G signal, and B signal from the gain of each of the RGB signals and information of determining a color temperature of a light source is acquired. With this information, a limit value (clip level) of an IR signal with respect to each of the RGB signals in IR correction is determined.

Note that as component systems of a video signal, there are an RGB system, in which RGB corresponding to three primary colors are components, and a color difference system using a luminance-color difference in which RGB are converted into a luminance signal and a color difference signal. As the color difference system, a system using Y, Cb, and Cr, a system using Y, Pb, and Pr, or the like is known. Y is luminance, Cb and Pb are acquired by multiplication of (B (blue)-Y (luminance)) by a coefficient, and Cr and Pr are acquired by multiplication of (R (red)-Y (luminance)) by a coefficient, Cb and Pb being B-Y signals and Cr and Pr being R-Y signals.

For example, Y, Cb, and Cr are expressed by the following expressions with respect to R, G, and B.

$Y=0.299*R+0.587*G+0.114*B$ $Cb=0.564*(B-Y)=-0.169*R-0.331*G+0.500*B$ $Cr=0.713*(R-Y)=0.500*R-0.419*G-0.081*B$

A color difference system is to reconstruct RGB signals into a component indicating luminance (luminance) and a component indicating a difference between two color signals and luminance signals (color difference). Since a human eye hardly realizes deterioration in resolution of a color, for example, when an information amount of a color difference is reduced to ½ at the time of transmission, a processing amount becomes ⅔ of that of RGB.

In the following, a method of setting this clip level (limit value) will be described with reference to an example.

First, processing of calculating a gain of each of RGB signals in the white-balance processing will be described.

In the white balance detection, a region considered to be white is set and the set white region is detected, the white balance detection being performed in this region. That is, in a case where each of a B-Y signal and an R-Y signal that are color difference signals in each pixel in the region considered to be white is integrated, a gain of each of the B-Y signal and the R-Y signal is adjusted in such a manner that an integration value thereof becomes zero. Also, a gain of each of the R, G, and B signals is adjusted in such a manner that integration values of the RGB signals become identical to each other.

An example of a region considered to be white in the white balance detection is illustrated in each of FIG. 36(a) and FIG. 36(b). As illustrated in FIG. 36(a), on a B-Y and R-Y plane, a white detection area is set in a vicinity of a movement locus due to a color temperature of a point to be white. Also, as illustrated in FIG. 36(b), a detection range of white with respect to a luminance signal level (such as equal to or higher than 70% and lower than 105% of white level) is set. In the color difference system, when a color difference signal is in a detection area of white and a luminance signal is in a detection range of white, the pixel is in a white region. Each of R, G, and B signals or each of a B-Y signal and an R-Y signal in the color difference system of a pixel in this region is integrated.

Alternatively, a gain of each the R, G, and B signals is adjusted in such a manner that integration values of R, G, and B are identical to each other.

For example, each of adjusted gains of R, G, and B of when a gain of each of the R, G, and B signals is adjusted in such a manner that integration values of R, G, and B become identical to each other becomes information indicating color temperature information. In the white-balance processing, it is possible to acquire each of the RGB signals of after the white-balance processing by respectively multiplying corresponding RGB signals by the gains of RGB which gains are adjusted in this manner.

That is, the RGB signals of after the white balancing are ($R$ signal of after WB)=(gain of $R$ signal)×($R$ signal of before WB)

($G$ signal of after WB)=(gain of $G$ signal)×($G$ signal of before WB)

($B$ signal of after WB)=(gain of $B$ signal)×($B$ signal of before WB).

Next, a method of calculating a limit value as a correction value of a value of an IR signal subtracted from each of signals of R (R+IR), G (G+IR), and B (B+IR) by using each of the gains of RGB which gains are adjusted by the white-balance processing as described above will be described. Note that a limit value of an IR signal subtracted from each of the signals of R (R+IR), G (G+IR), and B (B+IR) is a value that becomes an upper limit in a case where each of the color signals of R (R+IR), G (G+IR), and B (B+IR) is in a state of exceeding a pixel saturation level and is clipped at the pixel saturation level and in a case where a value of the IR signal is subtracted from each of the color signals.

A limit value (clip level) of the IR signal which value corresponds to each of the RGB signals is expressed by the following expressions when a saturation level of a pixel is Lsat, a ratio of an R signal to an IR signal of when white is imaged at a certain color temperature is Kr, and a limit value (clip level) of the IR signal in the R signal is Lclip-R.

$L\text{sat}=L\text{clip-}R+Kr*L\text{clip-}R$ $L\text{clip-}R=L\text{sat}/(1+Kr)$ Similarly, when a ratio of a G signal to an IR signal is Kg, a ratio of a B signal to an IR signal is Kb, a limit value (clip level) of the IR signal in the G signal is Lclip-G, and a limit value (clip level) of the IR signal in the B signal is Lclip-B, $L\text{clip-}G=L\text{sat}/(1+Kg)$ $L\text{clip-}B=L\text{sat}/(1+Kb)$.

Here, as described above, when a ratio of the G signal to the R signal is Kg/r and a ratio of the B signal to the R signal is Kb/r in imaging of white, ($R$ signal of after WB)=(gain of $R$ signal)×($R$ signal of before WB)

($G$ signal of after WB)=(gain of $G$ signal)×($G$ signal of before WB)

($B$ signal of after WB)=(gain of $B$ signal)×($B$ signal of before WB).

Accordingly, ($R$ signal of before WB)=($R$ signal of after WB)/(gain of $R$ signal)

($G$ signal of before WB)=($G$ signal of after WB)/(gain of $G$ signal)

($B$ signal of before WB)=($B$ signal of after WB)/(gain of $B$ signal).

Also, an R signal, a G signal, and a B signal of after WB are identical with respect to white. Thus, $Kg/r=$(gain of $R$ signal)/(gain of $G$ signal)

$Kb/r=$(gain of $R$ signal)/(gain of $B$ signal).

Also:

$Kg=Kr\times Kg/r$ $Kb=Kr\times Kb/r$.

Thus, $L\text{clip-}G=L\text{sat}/(1+Kr\times Kg/r)$ $L\text{clip-}B=L\text{sat}/(1+Kr\times Kb/r)$.

Accordingly, it is possible to calculate a red clip level Lclip-R, a green clip level Lclip-G, and a blue clip level Lclip-B of an IR signal.

Also, Kb/r can be used as a parameter indicating a color temperature. At each color temperature, when Kr with respect to Kb/r is measured and is previously recorded in a memory or the like, it is possible to determine a clip level of an IR signal for correction of each color according to Kb/r and Kr with respect to this Kb/r on the basis of a gain acquired by the white balance detection and the above-described expressions.

Also, in a case where IR correction (calculation of clip level of IR signal) is performed in the above manner, signal saturation levels in highlights of the RGB signals (level of signal in subtraction of corrected IR signal (limit value: clip level) from RGB signal that reaches pixel saturation level and is clipped) are not always identical to each other. This becomes a cause of a colored highlight and deterioration in image quality. Thus, as illustrated in FIG. 37 (a), FIG. 37 (b), and FIG. 37 (c), correction is performed after the white balancing in such a manner that highlight parts of RGB are clipped at the same level (RGB clip level). Accordingly, a colored highlight and unnaturalness in gradation of luminance are not generated.

In each of FIG. 37(a) to FIG. 37(c), a vertical axis is an output level of when an IR signal is subtracted from each of signals of RGB (R+IR, G+IR, and B+IR) and a horizontal axis indicates, for example, a position of a pixel in a Y axis direction on the imaging sensor 1 or passage of time of one pixel. In each graph in FIG. 37(a) to FIG. 37(c), in a case where a color temperature of a light source does not vary and a clip level (limit value) of each of RGB which level is calculated in the above-described manner is constant in a state in which each of the RGB signals reaches a pixel saturation level and in a case where an IR signal that is limited (clipped) at a limit value (clip level) is subtracted from each of the RGB signals at the pixel saturation level, since the pixel saturation level of each of the RGB signals is constant and limit values of the IR signal which values respectively correspond to RGB are constant, the RGB signals of after the subtraction are in a constant state, that is, in a constant state at the signal saturation levels. However, as illustrated in FIG. 37(a) to FIG. 37(c), the signal saturation levels of RGB are different from each other. In this case, highlight parts do not become white since output levels of the RGB signals are different. Thus, the signal saturation levels of the RGB signals are adjusted to a common RGB clip level with a signal saturation level of the R signal, which signal saturation level is the lowest, as the common RGB clip level (R signal saturation level) of the RGB signals.

That is, as illustrated in FIG. 37(a), by subtraction of an IR signal, in which a clip level (limit value) corresponding to an R signal is set, from the R signal, a signal saturation level (clip level) generated with respect to the R signal of after the subtraction is set as a reference. Among the signal saturation levels of the RGB signals of after the subtraction of the IR signal, that of the R signal is the lowest. Thus, as illustrated in FIG. 37 (b) and FIG. 37(c), the signal saturation level of the G signal and the signal saturation level of the B signal of after the subtraction of the IR signal are lowered to be adjusted to the RGB clip level that is identical to the signal saturation level of the R signal with the R signal as a reference as described above, whereby the signal saturation levels of the RGB signals of after the IR signal subtraction are adjusted to each other. Accordingly, high levels of the signals in highlight parts become the same and it is possible to prevent the highlights from being colored.

Note that in the above-described configuration, an IR signal is subtracted from each of an R signal, a G signal, and a B signal after being clipped. However, when the IR signal becomes equal to or higher than a level at which the above R signal, G signal, and B signal are saturated (above-described clip level of IR signal), the IR signal may be subtracted from the R signal, the G signal, and the B signal after a gain is lowered by a multiplier. In such a manner, unnaturalness in luminance gradation of the R signal, the G signal, and the B signal in the highlight parts may be prevented by a configuration with which a subtraction amount is controlled. Also, coloring may be prevented by processing of generating luminance signals from the RGB signals, decreasing gains of an R-Y signal and a B-Y signal at a level equal to or higher than that of a part where coloring is caused due to a difference in the signal saturation levels of the RGB signals, and removing the colors.

FIG. 38 is a block diagram illustrating signal processing in the signal processing unit 12 (illustrated in FIG. 26) of the imaging device 10 (illustrated in FIG. 26). Usually, in an RAW output, with respect to an output signal of each of pixels of R, G, B, and IR from the imaging sensor 1 (input signal from imaging sensor 1 in this signal processing), R, G, B, and IR are output line-sequentially or point-sequentially. Thus, for example, a synchronization circuit (not illustrated) of each color signal is provided in an input unit of an RAW signal from the imaging sensor 1.

In this case, in the synchronization circuit, R, G, B, and IR signals are respectively converted into image data in which all pixels are expressed in red R, image data in which all pixels are expressed in green G, image data in which all pixels are expressed in blue B, and image data in which all pixels are expressed in infrared IR by interpolation processing in image data for each frame. In other words, all of the pixels are brought into a state in which the R, G, B, and IR signals are output. Note that as an interpolation processing method, a known method can be used.

That is, the signal processing unit 12 includes a synchronization circuit (not illustrated) for each of sensor outputs of R+IR, G+IR, B+IR, and IR, and the sensor outputs of R+IR, G+IR, B+IR, and IR in FIG. 38 are signals of after passing through the synchronization circuits.

In the signal processing unit 12, limiters 20r, 20g, and 20b to clip an IR signal, which is subtracted from each of RGB signals, at a clip level (limit value) determined for each of RGB, multipliers 22r, 22g, and 22b to multiply the IR signal output from each of the limiters 20r, 20g, and 20b by a correction value and to perform correction, subtractors 23r, 23g and 23b to respectively subtract the clipped IR signals output from the multipliers 22r, 22g, and 22b from the signals of R+IR, G+IR, and B+IR, multipliers 24r, 24g, and 24b to respectively multiply the RGB signals, from which IR signals are subtracted, by gains of RGB for white balancing, and limiters 25r, 25g, and 25b to adjust signal saturation levels of the RGB signals from which the IR signals are subtracted and on which the white balancing is performed are provided.

Also, the signal processing unit 12 includes a control circuit 21 that respectively calculates clip levels (limit value) of IR signals with respect to the RGB signals and outputs these to the limiters 20r, 20g, and 20b. Also, the control circuit 21 outputs a correction value to each of the multiplier 22r, 22g, and 22b, outputs gains of RGB calculated for the white balancing to the multipliers 24r, 24g and 24b, and outputs an RGB clip level (R signal saturation level) to adjust the signal saturation levels of the RGB signals to the limiters 25r, 25g and 25b. Also, the signal processing unit includes a white-balance detection circuit 26 to calculate gains for the white balancing from RGB output signals from the signal processing unit 12.

An IR signal as a sensor output of IR is transmitted to each of the limiter for R 20r, the limiter for G 20g, and the limiter for B 20b provided in the signal processing unit 12 and is clipped at a limit value (clip level) for the IR signal which value is set for each color as described above.

In this case, the above-described red clip level Lclip-R, green clip level Lclip-G, and blue clip level Lclip-B of the IR signal, which levels are calculated in the control circuit 21, are respectively output to the corresponding limiter for R 20r, the limiter for G 20g, and the limiter for B 20b and respectively become limit values of the limiter for R 20r, the limiter for G 20g, and the limiter for B 20b. Accordingly, an output level of the IR signal, which level exceeds the clip level (limit value), is clipped at the clip level by each of the limiters 20r, 20g, and 20b.

Also, values output from the limiter for R 20r, the limiter for G 20g, and the limiter for B 20b are IR signals to be subtracted from the RGB signals. These IR signals are multiplied by the correction values, which are output from the control circuit 21, by the multipliers 22r, 22g, and 22b. In the present configuration, IR components included in an R pixel, a G pixel, and a B pixel are substantially at the same level with that in an IR pixel. However, there is a possibility that some errors are generated in a signal level due to a difference in openings of the R pixel, the G pixel, and the B pixel, a variation in an amplifier gain inside a sensor, or the like. That is, for example, values output from the limiters 20r, 20g, and 20b have a tendency of becoming slightly larger than necessary values and are corrected by the multipliers 22r, 22g, and 22b by multiplication by correction values according to the RGB signals.

The subtractors 23r, 23g, and 23b subtract IR signals, which are clipped and corrected in such a manner and which respectively correspond to RGB, from the signals of R+IR, G+IR, and B+IR. The multipliers 24r, 24g, and 24b perform white balancing by multiplying the signals, which are output from the subtractors 23r, 23g, and 23b, by gains of RGB which gains are calculated in white-balance processing. Into the multipliers 24r, 24g, and 24b, gains of RGB which gains are calculated by the control circuit 21 on the basis of RGB signals detected in the white-balance detection circuit 26 are respectively input. Also, RGB signals output from the multipliers 24r, 24g, and 24b are clipped when clipped IR signals are subtracted therefrom.

That is, when an IR signal limited at a limit value in the above-described manner is subtracted in a state in which each of RGB signals is clipped at a pixel saturation level, clipping at a signal saturation level that is a value acquired by subtraction of the limit value from the pixel saturation level is performed. When signal saturation levels of the RGB signals are different from each other, a highlight part is colored. Thus, in order to adjust signal saturation levels of RGB, limit values are set in the limiters 25r, 25g, and 25b in such a manner that RGB clip levels of the RGB signals become the same. Here, clip levels of the G signal and the B signal are adjusted with a signal saturation level of the R signal as a limit value of an RGB level.

The signal processing in the above-described manner will be described with an R (R+IR) signal as an example. An R signal output from the imaging sensor 1 is interpolated by a synchronization circuit and is set as an R signal of each pixel used as an image in the imaging sensor 1. Similarly, a G signal, a B signal, and an IR signal are processed in the synchronization circuit and are set as a G signal, a B signal, and an IR signal of each pixel used as an image.

The IR signal is transmitted to the limiter 20r. To the limiter 20r, Lclip-R that is a limit value of an IR signal for an R signal and is calculated in the above-described manner in the control circuit 21 is output. This becomes a limit value of the limiter 20r. Thus, the IR signal passing through the limiter 20r is clipped in such a manner as to reach a peak at the limit value. That is, an output level of the IR signal exceeding the limit value becomes the limit value.

The IR signal clipped at the limit value in such a manner is transmitted to the multiplier 22r, corrected by being multiplied by a correction value calculated (or stored) in the control circuit 21, and transmitted to the subtractor 23r. Into the subtractor 23r, the above-described synchronized R signal is input and the IR signal that is limited and corrected in the above-described manner is input. A value of the IR signal is subtracted from that of the R signal. Then, the R signal from which the IR signal is subtracted is transmitted to the multiplier 24r. Into the multiplier 24r, the R signal and a gain of the R signal, which gain is calculated by the above-described white-balance detection circuit 26 and control circuit 21, are input. The R signal is multiplied by the gain.

An R signal on which the white-balance processing is performed is output from the multiplier 24r. This R signal is input into the limiter 25r. To the limiter 25r, the above-described RGB clip level is transmitted from the control circuit 21. With this as a limit value, an R signal exceeding the RGB clip level is clipped. However, in this signal processing unit 12, the RGB clip level is identical to an R signal saturation level. The R signal from which the IR signal is subtracted is already in a state of being clipped at the R signal saturation level. Thus, the processing in the limiter 25r is not necessarily required with respect to the R signal. Note that the G signal and the B signal are clipped at the RGB clip level by the limiter 25g and 25b with the RGB clip level, which is identical to the R signal saturation level, as a limit value.

The G signal and the B signal are processed in a similar manner and each of the processed RGB signals is output as an output signal 14 of a color image of visible light as illustrated in FIG. 1. Also, the IR signal is output as an output signal 15 of an infrared-light image after passing through the synchronization circuit. Note that the IR signal output as an infrared image signal is not limited by the above-described limit value.

Figure 39:
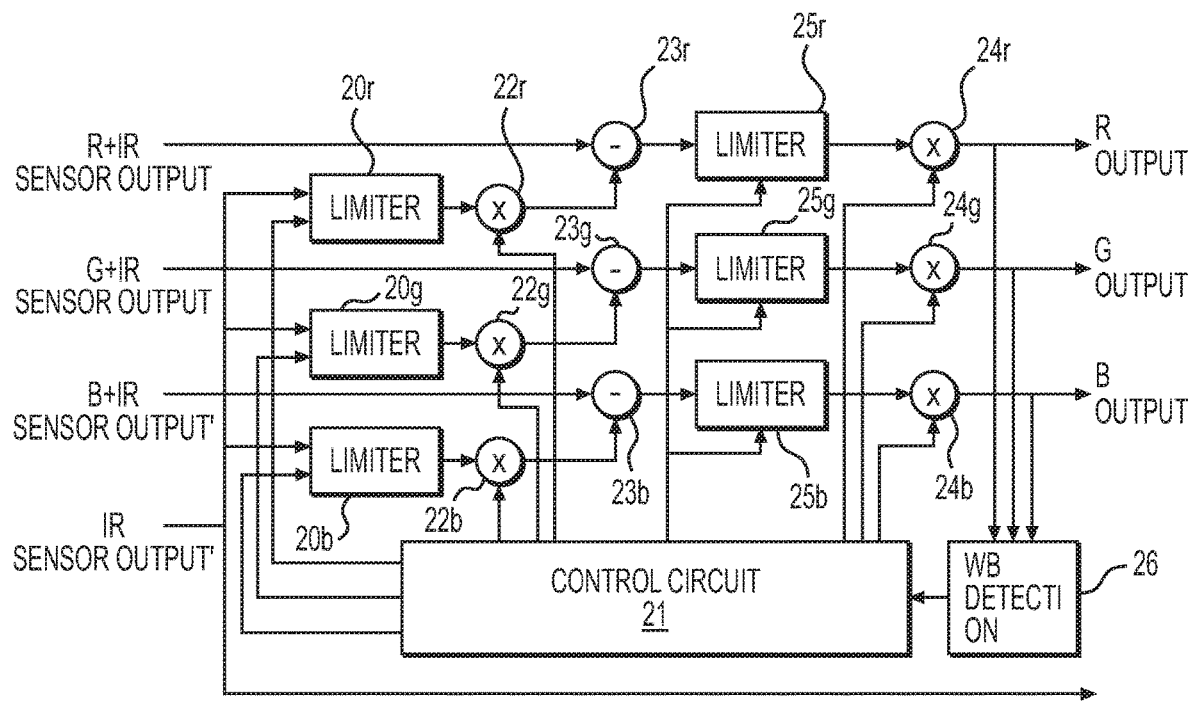
FIG. 39 is a block diagram illustrating the same and illustrating a different example of a signal processing unit.

A block diagram illustrated in FIG. 39 is a modification example of the block diagram illustrated in FIG. 38. A different between the block diagram illustrated in FIG. 39 and the block diagram illustrated in FIG. 38 is that multipliers 24r, 24g and 24b for white balancing are arranged after limiters 25r, 25g and 25b to adjust clip levels of RGB signals, from which IR signals are subtracted, in FIG. 39 while the limiters 25r, 25g, and 25b to adjust signal saturation levels of RGB signals, from which IR signals are subtracted, are arranged after the multipliers 24r, 24g, and 24b for white balancing in the block diagram in FIG. 38.

Accordingly, while signal saturation levels of the RGB signals on which white balancing is performed are adjusted in FIG. 38, white-balance processing is performed after adjustment of signal saturation levels of RGB signals in FIG. 39.

According to such an image processing system and an imaging processing method, it is possible to prevent a decrease in luminance of a highlight part and to prevent the highlight part from being colored instead of becoming white as described above in a camera (imaging device) that makes it possible to perform both of color photographing with visible light and photographing with infrared light by using DBPF 5 without switching whether to use an infrared cut filter.

Next, a seventh embodiment will be described. In the above-described sixth embodiment, a clip level (control value) in a case where an RGB-IR color filter is used has been described. In the present embodiment, a clip level of RGB-C will be described.

In an imaging sensor 1 of RFB-IR, an IR signal only includes an IR component while an IR component is included in each of RGB signals. Thus, even when each of the RGB signals is saturated, the IR signal is not saturated. Here, when an IR component a level of which becomes higher even after the RGB signals are saturated is removed, a decrease to a saturation level or lower is caused by removal of the IR component after saturation of RGB as described above. Also, basically, a value of RGB of after the saturation becomes smaller as light quantity of IR becomes larger.

On the other hand, in an imaging sensor 1 of RGB–C, C=R+G+B in a visible-light band. Thus, in a case where a range is adjusted to RGB, a pixel of C reaches a saturation level as illustrated in FIG. 40.

In this case, when the pixel of C reaches the saturation level, C<R+G+B is acquired in the visible-light band. Accordingly, in a case where IR' is acquired by calculation as described above, IR'=IR+(R+G+B–C)/2 is acquired. Since (R+G+B–C) becomes larger than 0 when C reaches the saturation level, IR' acquired by calculation>actual IR, as illustrated in FIG. 41.

In such a manner, when the IR' component acquired by the calculation from R, G, B, and C is removed in a case where C reaches the saturation level, a signal level with respect to C reaches a peak at the saturation level but an IR component can become higher even after C reaches the saturation level. Also, as illustrated in FIG. 41, IR'>IR is acquired after C is saturated. Thus, when this is removed from saturated C, a signal level becomes lower as a level of actual light quantity becomes higher as illustrated in FIG. 42. Also, after C is saturated, IR'>IR is also acquired with respect to signal levels of RGB other than C. Thus, as a level of actual light quantity becomes higher, the signal levels may become lower although a degree is not as large as that of C.

Thus, in the seventh embodiment, each signal is clipped in such a manner as not to be equal to or larger than a predetermined value and an IR signal is separated from each of the RGB signals.

First, a signal level of R/G/B/W/IR is detected.

Then, clip levels in R, G, B, and W are calculated in the following manner.

($W$ clip level)=(calculated by saturation level of $W$ pixel ($C$ pixel))

($R$ clip level)=($W$ clip level)($R$ level+IR level)/($W$ level+IR level)

($G$ clip level)=($W$ clip level)($G$ level+IR level)/($W$ level+IR level)

($B$ clip level)=($W$ clip level)($B$ level+IR level)/($W$ level+IR level)

In a case where a signal level of W is detected, the W clip level is calculated on the basis of a saturation level that does not become higher with this signal level as a peak. The clip levels of RGB are calculated by the above-described expressions. The clip levels are calculated when the W level reaches the saturation level.

In a case where such clip processing is performed, the above-described separation device 51 is in a manner illustrated in a block diagram in FIG. 43. Signal levels of R, G, B, and W of each pixel are separated by an interpolation method or the like in a color separation device 61 and transmitted to a level detection/clip-level calculation device 63 and a clip processing device 62. In the level detection/clip-level calculation device 63, clip levels of R, G, B, and W are calculated on the basis of the above-described expressions and detected levels of R, G, B, and W. Each of the clip levels of R, G, B, and W calculated in the clip-level calculation device 63 is transmitted to the clip processing device 62. Processing of performing clipping is performed in a case where signal levels of R, G, B, and W input into the clip processing device 62 exceed the clip levels. The signal levels of R, G, B, and W output from the clip processing device 62 are input into an IR correction/IR generation device 64. In the IR correction/IR generation device 64, an IR signal is removed from each of R, G, B, and W signals and an IR signal is generated.

As illustrated in FIG. 44, the clip-level calculation device 63 calculates an IR signal level in an IR matrix device 66 on the basis of signal levels of R, G, B, and W separated in the color separation device 61, inputs the IR signal and the signal levels of R, G, B, and W including IR components into an IR correction device 67, and performs IR correction of removing an IR signal level from each of the signal levels of R, G, B and W.

Into a level detection device 68, the signal level of IR is input from the IR matrix device 66 and each of the signal levels of R, G, B, and W from which IR components are removed is input from the IR correction device 67.

Each of the signal levels of R, G, B, W, and IR detected in the level detection device 68 is input into a clip-level calculation device 69. As described above, a clip level of each of the signal levels of R, G, B, and W is calculated in the clip-level calculation device 69.

In the clip processing device 62, on the basis of each of the clip levels of R, G, B, and W which levels are calculated in such a manner, each of the signal levels reaches a peak at the clip level as illustrated in FIG. 45 in a case where each of the signal levels of R, G, B, and W exceeds the clip level.

Similarly to the above-described third embodiment, on the basis of each of the R, G, B, and W signals clipped in such a manner, an IR component is calculated and the IR component is separated from each of the R, G, B, and W signals including the IR components. Here, an IR signal acquired by calculation as illustrated in FIG. 46 is also clipped and reaches a peak at a signal level of IR of when W reaches a saturation level. Accordingly, a state of being clipped at a clip level after removal of an IR component is kept even after an IR component is removed from each of the signal levels of R, G, B, and W as illustrated in FIG. 47.

In this case, a luminance signal calculated from each of the signal levels of R, G, B, and W is also in a state of being clipped. Thus, by using a modification example of a separation device 51 to perform color separation, IR separation, and IR correction as illustrated in FIG. 48, it is possible to prevent a luminance level from being clipped and to gradate the luminance level even after a pixel of W reaches a saturation level.

As illustrated in FIG. 48, in this modification example of the separation device 51, signal levels of R, G, B, and W of each pixel are separated by an interpolation method or the like in a color separation device 61 and transmitted to a level detection/clip-level calculation/IR signal generation device 63 and a clip processing device 62. In the level detection/clip-level calculation device 63, clip levels of R, G, B, and W are calculated on the basis of the above-described expressions and detected levels of R, G, B, and W. Each of the clip levels of R, G, B, and W calculated in the clip-level calculation device 63 is transmitted to the clip processing device 62. Processing of performing clipping is performed in a case where signal levels of R, G, B, and W input into the clip processing device 62 exceed the clip levels. The signal levels of R, G, B, and W output from the clip processing device 62 are input into a first IR correction/IR generation device 64. In the first IR correction/IR generation device 64, an IR signal is removed from each of R, G, B, and W signals to be clipped and an IR signal is generated. The RGB signals calculated in the first IR correction/IR generation device 64 are used as color signals such as color difference signals.

Also, a second IR correction: an IR generating device 65 of this modification example is included. Into a second IR correction/IR generation device 65, R, G, B, and W signals that are not to be clipped are input from the color separation device 61. Then, IR generation and IR correction are performed and RGB signals from which IR components are removed are output. Here, the RGB signals are less likely to reach saturation levels compared to a W signal and are less likely to reach their peaks. As illustrated in FIG. 49, by using these RGB signals for calculation of luminance, it is possible to prevent a luminance level from being clipped and to slightly gradate the luminance even in a state in which the luminance is high.

Next, an eighth embodiment will be described. In the eighth embodiment, a clip level of each of R, G, B, and W signals is determined similarly to the seventh embodiment. Unlike the seventh embodiment, clip levels of an IR signal and a W signal are determined without determination of a clip level of each of R, G, and B signals in the eighth embodiment. As illustrated in FIG. 50, IR correction is performed by an IR signal clipped at a control value by limit processing.

A W clip level is set on the basis of a saturation level of W.

($W$ clip level)=(calculated by saturation level of $W$ pixel ($C$ pixel))

An IR clip level is determined on the basis of the following expression.

(IR clip level)=($W$ clip level)(IR level)/($W$ level+IR level)

Accordingly, as illustrated in FIG. 50, in a case where a signal level of IR which level is clipped in the above-described manner is removed from a signal level of W, which reaches a saturation level, when a W signal is substantially saturated, the signal level of W is clipped at a signal level lower than the saturation level.

When it is assumed that signal levels of RGB do not reach saturation levels in a range of a condition of use in a case where correction of removing a clipped IR signal from each of the signal levels of RGB, the signal levels of RGB can become higher even after the IR signal reaches a clip level in the removal of the IR signal as illustrated in FIG. 51. Thus, each of the RGB signals is not clipped and can become higher.

In a separation device 51 of the eighth embodiment which device is illustrated in FIG. 52, signal levels of R, G, B, and W of each pixel are separated by an interpolation method or the like in a color separation device 61 and separated R, G, B, and W signals are output to an IR signal generation device 71 and an IR correction device 64. In the IR signal generation device 71, a clip level of a generated IR signal is calculated and an IR signal that is clipped in a case where the clip level is exceeded is output to the IR correction device 64. In the IR correction device 64, the IR signal is removed from each of the signal levels of R, G, B and W.

As illustrated in FIG. 53, in the IR signal generation device 71, each of the R, G, B, and W signals is transmitted from the color separation device 61 to an IR correction device 72 and an IR matrix device 73. An IR signal generated in the IR matrix device 73 is output to the IR correction device 72 and a limit processing device 74. In the IR correction device 72, IR correction of removing the IR signal from each of the signal levels of R, G, B, and W is performed, the corrected R, G, B, and W signals and the IR signal are transmitted to a level detection device 75, the R, G, B, and W signals and the IR signal are transmitted to a limit level calculation device 76, and a limit level (clip level) of the IR signal is input into the limit processing device 74. Into the limit processing device 74, an IR signal level is input from the IR matrix device 73. In a case of exceeding the limit level, the IR signal level is clipped at the limit level.

Similarly to the seventh embodiment, in such an eighth embodiment, it is possible to prevent a situation in which signal levels of R, G, B, and W become lower in a condition in which these supposed to become higher and to gradate each of signal levels of RGB even in a state in which a signal level of W is saturated. Accordingly, it is also possible to gradate a luminance signal even in a situation in which the signal level of W is saturated.

Note that an expression for generation of a luminance signal is $$Y=(Kr^*R+Kg^*G+Kb^*B+Kw^*W)+Kir^*\text{IR}.$$

It is possible to control sensitivity by changing a ratio of IR. Note that in a case where IR illumination is used at night, there is no visible signal and there are only IR signals in all pixels. In this case, it is possible to generate a luminance signal with high sensitivity in high resolution by turning off IR correction and generating the luminance signal from signals of all pixels. In a case where IR illumination is embedded in a camera, signal processing is switched along with this.

An expression for generating luminance in IR illumination in this case is $$Y=Kr^*R+Kg^*G+Kb^*B+Kw^*W(\text{IR correction OFF}).$$

Note that in each pixel, quantity of received light from infrared illumination which light passes through a second wavelength band of DBPF 5 and each filter becomes larger than quantity of received light in a visible-light band. Thus, basically, each pixel is in a state in which a signal level of infrared light is output.

REFERENCE SIGNS LIST

1 imaging sensor
2 imaging sensor main body
3 color filter (filter)
3a color filter (filter)
3b color filter (filter)
3c color filter (filter)
5 DBPF (optical filter: filter)
A third wavelength band
B fourth wavelength band
IR first wavelength band
DBPF (IR) second wavelength band
DBPF (VR) visible-light band

The invention claimed is:
1. An imaging sensor comprising:
 an imaging sensor main body in which a light-receiving element is arranged in each pixel; and
 a filter including:
  a color filter provided on the imaging sensor main body, and configured in a manner such that four or more kinds of filter parts having different spectral transmission characteristics in response to wavelengths in a visible-light band are arranged in a predetermined array corresponding to an array of the pixels of the imaging sensor main body; and an optical filter which has:
  i) a transmission characteristic in the visible-light band; and
  ii) a light blocking characteristic in a first wavelength band adjacent to a longer wavelength side of the visible-light band, except for a second wavelength band for light transmission, the second wavelength band being a predetermined range having a lower limit and an upper limit within the first wavelength band, wherein:
the color filter has a third wavelength band, in which transmittances of the four or more kinds of filter parts are approximate to one another, on a longer wavelength side than the visible-light band; and
the spectral transmission characteristics of the optical filter and the spectral transmission characteristics of the four or more kinds of filter parts in the color filter are set in a manner such that the second wavelength band is included in the third wavelength band.

2. The imaging sensor according to claim 1, wherein in the third wavelength band, a transmittance difference among the four or more kinds of filter parts is 20% or less.

3. The imaging sensor according to claim 1, wherein the four or more kinds of filter parts consist of:
  i) one kind of the filter parts having a light transmission characteristic in substantially a whole wavelength band of the visible-light band, or having a blocking characteristic in substantially a whole wavelength band of the visible-light band; and
  ii) the other kinds of the filter parts having transmission characteristics in limited wavelength bands corresponding to respective colors in the visible-light band.

4. The imaging sensor according to claim 3, wherein:
the one kind of the filter parts has a blocking characteristic in substantially the whole visible-light band, and has a transmission characteristic in a fourth wavelength band on the longer wavelength side than the visible-light band; and
a transmission characteristic of the optical filter and the spectral transmission characteristic of each of the four or more kinds of filter parts are set in such a manner that the second wavelength band of the optical filter is included in the fourth wavelength band.

5. The imaging sensor according to claim 2, wherein:
in the color filter, four kinds of the filter parts of red, blue, and green with transmission characteristics in the limited wavelength bands corresponding to the respective colors in the visible-light band and of a fourth filter part with a blocking or transmission characteristic in substantially a whole wavelength band in the visible-light band are arranged in a basic array with four rows and four columns;
the same kinds of the filter parts are arranged separately so as not to be adjacent to each other in a row direction and a column direction;
one each of the red, the blue, the green and the fourth filter parts are arranged in each column; and
two each of two kinds of the filter parts among the red, the blue, the green, and the fourth filter parts are arranged in every other row.

6. The imaging sensor according to claim 2, wherein:
the color filter includes eight green filter parts, four red filter parts, two blue filter parts and two fourth filter parts among the four kinds of the filter parts of red, blue, and green with transmission characteristics in the limited wavelength bands corresponding to the respective colors in the visible-light band and of a fourth filter part with a blocking or transmission characteristic in substantially a whole wavelength band in the visible-light band;
the eight green filter parts, the four red filter parts, the two blue filter parts and the two fourth filter parts are arranged in a basic array with four rows and four columns; and
the same kinds of the filter parts are arranged separately so as not to be adjacent to each other in a row direction and a column direction.

7. The imaging sensor according to claim 2, wherein:
the color filter includes eight green filter parts, four fourth filter parts, two red filter parts and two blue filter parts among the four kinds of the filter parts of red, blue, and green with transmission characteristics in the limited wavelength bands corresponding to the respective colors in the visible-light band and of a fourth filter part with a blocking or transmission characteristic in substantially a whole wavelength band in the visible-light band;
the eight green filter parts, the four fourth filter parts, the two red filter parts and the two blue filter parts are arranged in a basic array with four rows and four columns; and
the same kinds of the filter parts are arranged separately so as not to be adjacent to each other in a row direction and a column direction.

8. The imaging sensor according to claim 3, further comprising:
a signal separating/outputting device to:
  separate a signal, which is sequentially inputted from each pixel of the imaging sensor main body, into:
    an image signal in the visible-light band, which is free from a signal in a wavelength band on the longer wavelength side than the visible-light band, and
    an infrared image signal on the longer wavelength side than the visible-light band, and
  perform an output thereof.

9. An imaging device comprising:
an imaging sensor in which a light-receiving element is arranged in each pixel;
a color filter in which four or more kinds of filter parts are arranged in a predetermined array in a manner corresponding to an array of pixels of the imaging sensor, the four or more kinds of filter parts having different spectral transmission characteristics in response to wavelengths in a visible-light band;
an optical system including a lens to form an image on the imaging sensor;
an optical filter that has:
  (i) a transmission characteristic in the visible-light band, and
  (ii) a light blocking characteristic in a first wavelength band adjacent to a longer-wavelength side of the visible-light band, except for a second wavelength band for light transmission, the second wavelength band being a predetermined range having a lower limit and an upper limit within the first wavelength band;
a signal processing device that is capable of processing a signal output from the imaging sensor and of outputting a visible image signal and an infrared image signal, wherein:
a spectral transmission characteristic of the optical filter and the spectral transmission characteristic of each of the four or more kinds of filter parts in the color filter are set in such a manner that:
the second wavelength band of the optical filter is included in a third wavelength band in which transmittances of the four or more kinds of filter parts are approximate to one another on a longer wavelength side than the visible-light band.

10. The imaging device according to claim 9, wherein in the third wavelength band, a transmittance difference among the four or more kinds of filter parts of different colors is 10% or less.

11. The imaging device according to claim 9, wherein: the color filter includes four or more kinds of the filter parts each of which has:
(i) a transmission characteristic in a limited wavelength band corresponding to respective colors in the visible-light band;
(ii) a transmission characteristic in substantially a whole wavelength band of the visible-light band or
(iii) a blocking characteristic in substantially the whole wavelength band of the visible-light band.

12. The imaging device according to claim 9, wherein: one kind of the filter parts has a blocking characteristic in substantially a whole visible-light band and has a transmission characteristic in a fourth wavelength band on the longer wavelength side than the visible-light band; and
a spectral transmission characteristic of the optical filter and the spectral transmission characteristic of each of the four or more kinds of filter parts are set in such a manner that the second wavelength band of the optical filter is included in the fourth wavelength band.

13. The imaging device according to claim 12, further comprising:
an infrared illumination unit for producing an infrared illumination during imaging of an infrared image, wherein:
setting is performed in such a manner that:
(i) a fifth wavelength band, which is a wavelength band of infrared light emitted from the infrared illumination unit, is included in the third wavelength band and the fourth wavelength band; and
(ii) the second wavelength band of the optical filter is substantially overlapped with the fifth wavelength band.

14. The imaging sensor according to claim 3, wherein: the four or more kinds of the filter parts of the color filter correspond to four or more different colors;
one kind of the filter parts has a transmission characteristic in substantially a whole visible-light band and has a transmission characteristic in a fourth wavelength band on the longer wavelength side than the visible-light band; and
the spectral transmission characteristic of the optical filter and the spectral transmission characteristic of each of the four or more kinds of filter parts are set in such a manner that the second wavelength band of the optical filter is included in the fourth wavelength band.

15. The imaging device according to claim 9, wherein the four or more kinds of the filter parts consist of:
i) one kind of the filter parts having a light transmission characteristic in substantially a whole wavelength band of visible-light band, or having a light blocking characteristic in substantially a whole wavelength band of the visible-light band; and ii) the other kinds of the filter parts having transmission characteristics in limited wavelength bands corresponding to respective colors in the visible-light band.

16. The imaging device according to claim 9, wherein: the color filter is provided on the imaging sensor; and the optical filter is provided on a surface of the lens constituting the optical system.

17. The imaging device according to claim 9, wherein: the color filter and the optical filter are provided on the imaging sensor.

18. The imaging device according to claim 9, wherein: four or more kinds of the filter parts correspond to four or more different colors;
one kind of the filter parts has a transmission characteristic in substantially a whole visible-light band and has a transmission characteristic in a fourth wavelength band on the longer wavelength side than the visible-light band; and
the spectral transmission characteristic of the optical filter and the spectral transmission characteristic of each of the four or more kinds of filter parts are set in such a manner that the second wavelength band of the optical filter is included in the fourth wavelength band.

19. The imaging device according to claim 9, further comprising:
a signal separating/outputting device to separate a signal, which is sequentially inputted from each pixel of the imaging sensor, into (i) an image signal in the visible-light band, which is free from a signal in a wavelength band on the longer wavelength side than the visible-light band, and (ii) an infrared image signal on the longer wavelength side than the visible-light band, and to perform an output thereof.

20. An imaging method for use when operating an imaging device, the imaging device comprising:
an imaging sensor in which a light-receiving element is arranged in each pixel;
a color filter in which a four or more kinds of filter parts are arranged in a predetermined array in a manner corresponding to an array of pixels of the imaging sensor, the four or more kinds of the filter parts having different spectral transmission characteristics in response to wavelengths in a visible-light band, and each filter part having a third wavelength band in which transmittances of each filter part are approximate to one another on a longer wavelength side than the visible light band; and
an optical filter that has:
(i) a transmission characteristic in the visible-light band; and
(ii) a light blocking characteristic in a first wavelength band adjacent to a longer wavelength side of the visible-light band, except for a second wavelength band for light transmission, the second wavelength band being a predetermined range having a lower limit and an upper limit within the first wavelength band, and the second wavelength band being set to be included in the third wavelength band of the color filter,
the method comprising:
an imaging step at which an optical signal inputted through the optical filter and the color filter is converted into a sensor signal in the imaging sensor;
a first signal processing step at which an infrared light component is removed from the sensor signal outputted at the imaging step; and a second signal processing step at which an infrared image output signal is outputted from the sensor signal outputted at the imaging step.

* * * * *